(12) United States Patent
Ooike et al.

(10) Patent No.: US 8,421,142 B2
(45) Date of Patent: Apr. 16, 2013

(54) NONVOLATILE SEMICONDUCTOR MEMORY DEVICE AND METHOD OF MANUFACTURING THE SAME

(75) Inventors: Noboru Ooike, Kawasaki (JP); Tomomi Kusaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 337 days.

(21) Appl. No.: 12/886,160

(22) Filed: Sep. 20, 2010

(65) Prior Publication Data

US 2011/0291174 A1   Dec. 1, 2011

(30) Foreign Application Priority Data

Jun. 1, 2010  (JP) ................................. 2010-125739

(51) Int. Cl.
*H01L 29/788* (2006.01)
*H01L 21/336* (2006.01)

(52) U.S. Cl.
USPC ............... 257/316; 257/E29.3; 257/E21.409; 438/259

(58) Field of Classification Search .................. 257/316, 257/E29.3, E21.409; 438/259
See application file for complete search history.

(56) References Cited

U.S. PATENT DOCUMENTS

| | | | | |
|---|---|---|---|---|
| 5,510,283 | A * | 4/1996 | Maari | 438/262 |
| 6,084,251 | A * | 7/2000 | Tamamura et al. | 257/94 |
| 6,991,985 | B2 * | 1/2006 | Dong et al. | 438/261 |
| 7,067,425 | B2 * | 6/2006 | Lee | 438/689 |
| 2004/0207024 | A1 * | 10/2004 | Eikyu | 257/374 |
| 2008/0090353 | A1 * | 4/2008 | Park et al. | 438/264 |
| 2008/0121977 | A1 * | 5/2008 | Choi et al. | 257/321 |
| 2012/0286346 | A1 * | 11/2012 | Nakazawa | 257/316 |

FOREIGN PATENT DOCUMENTS

| | | |
|---|---|---|
| JP | 2000-31481 | 1/2000 |
| JP | 2006-59843 | 3/2006 |

* cited by examiner

*Primary Examiner* — Lex Malsawma
(74) *Attorney, Agent, or Firm* — Oblon, Spivak, McClelland, Maier & Neustadt, L.L.P.

(57) ABSTRACT

In one embodiment, a nonvolatile semiconductor memory device includes a substrate, and a well region formed in the substrate. The device further includes device regions formed in the well region and defined by isolation trenches formed in the well region, the device regions extending in a first direction parallel to a principal surface of the substrate, and being adjacent to one another in a second direction that is perpendicular to the first direction. The device further includes isolation insulators buried in the isolation trenches to isolate the device regions from one another. The device further includes floating gates disposed on the device regions via gate insulators, and a control gate disposed on the floating gates via an intergate insulator. The device further includes first diffusion suppressing layers formed inside the respective device regions to divide each of the device regions into an upper device region and a lower device region. The device further includes second diffusion suppressing layers formed on side surfaces of the respective upper device regions, the side surfaces being perpendicular to the second direction.

19 Claims, 15 Drawing Sheets

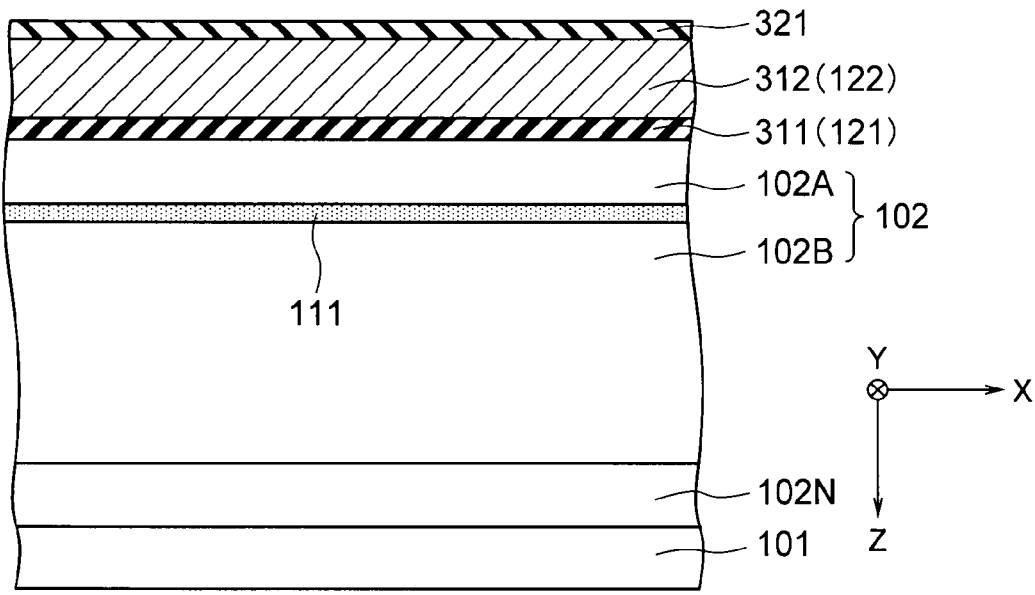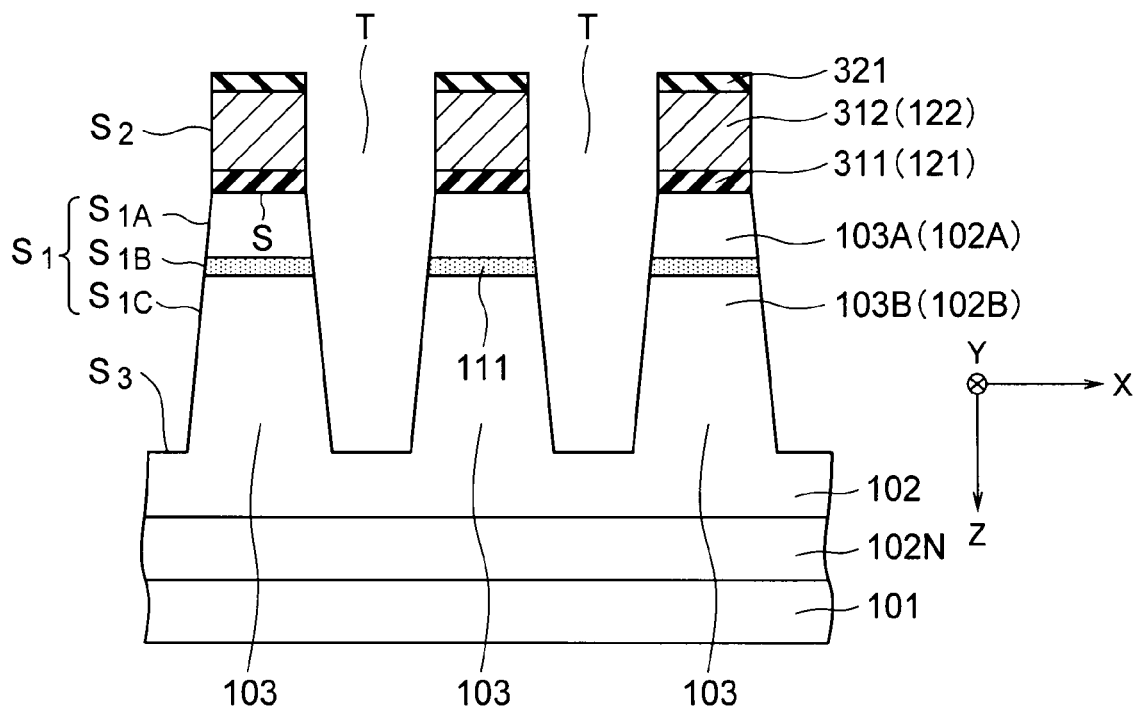
FIG.6

NONVOLATILE SEMICONDUCTOR MEMORY DEVICE AND METHOD OF MANUFACTURING THE SAME

CROSS REFERENCE TO RELATED APPLICATION

This application is based upon and claims the benefit of priority from the prior Japanese Patent Application No. 2010-125739, filed on Jun. 1, 2010, the entire contents of which are incorporated herein by reference.

FIELD

Embodiments described herein relate to a nonvolatile semiconductor memory device and a method of manufacturing the same, for example, applied to an NAND nonvolatile memory which is configured to record data by storing electric charges in a floating gate.

BACKGROUND

In procedures of manufacturing an NAND nonvolatile memory, when forming a well region in a substrate, impurity implantation is performed to obtain a channel profile. An example of impurities (dopant) to be used is boron (B).

However, even if the impurity implantation is performed so as to obtain an ideal channel profile, the implanted impurities diffuse due to heating processes performed later, so that the channel profile deviates from the ideal profile. For example, if the impurities in the channel surface diffuse deeper due to the heating processes, the channel potential of unselected NAND strings connected to unselected bit lines does not become higher because depletion layers do not extend. As a result, the memory boosting efficiency becomes poorer, and writing errors at a recording time (programming time) increase.

BRIEF DESCRIPTION OF THE DRAWINGS

FIGS. 5 to 8 show sectional side views for explaining a method of manufacturing the nonvolatile semiconductor memory device according to the first embodiment;

DETAILED DESCRIPTION

Figure 1:
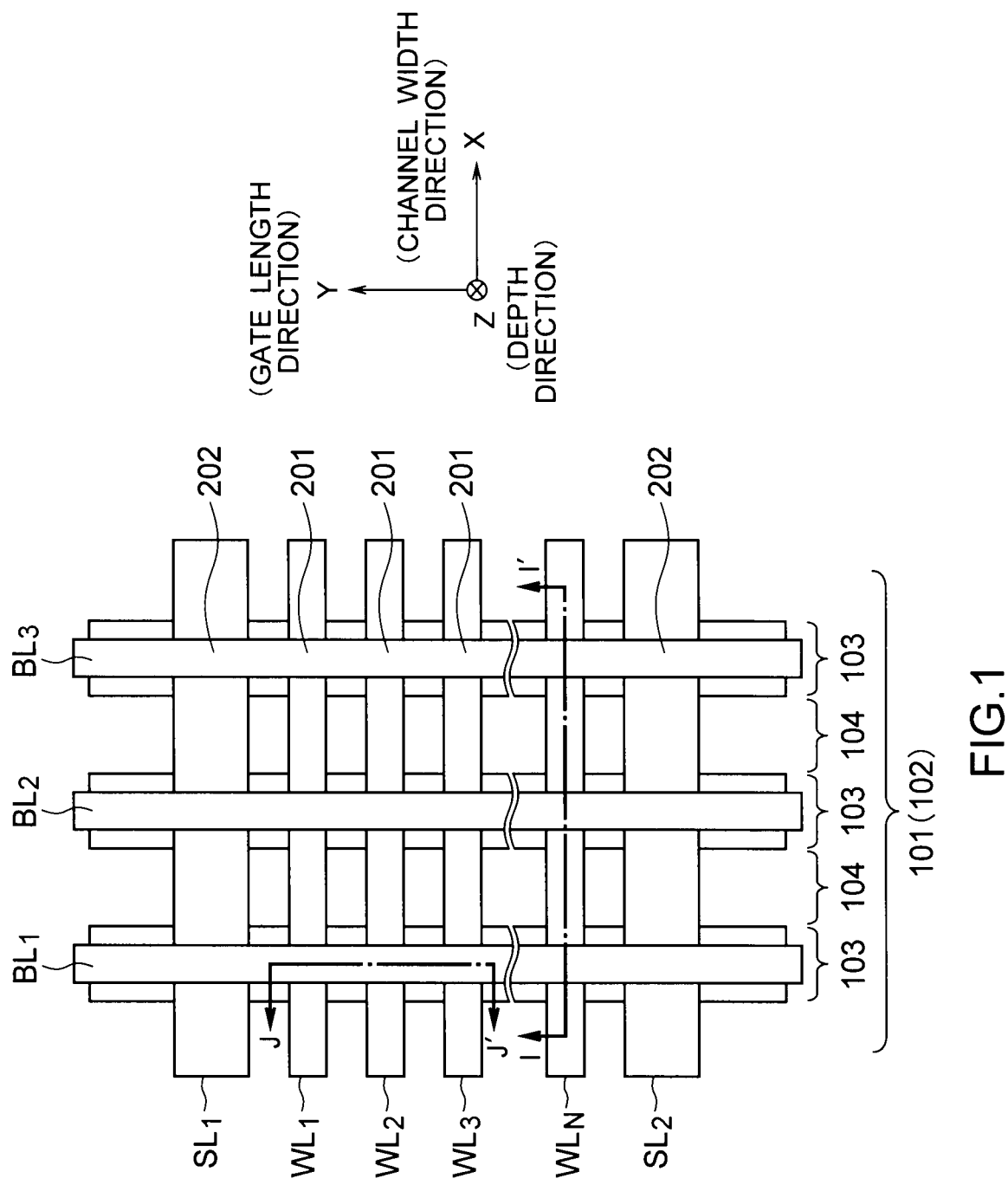
FIG. 1 is a plan view showing a structure of a nonvolatile semiconductor memory device according to a first embodiment.

Embodiments will now be explained with reference to the accompanying drawings.

An embodiment described herein is, for example, a nonvolatile semiconductor memory device including a substrate, and a well region formed in the substrate. The device further includes device regions formed in the well region and defined by isolation trenches formed in the well region, the device regions extending in a first direction parallel to a principal surface of the substrate, and being adjacent to one another in a second direction that is perpendicular to the first direction. The device further includes isolation insulators buried in the isolation trenches to isolate the device regions from one another. The device further includes floating gates disposed on the device regions via gate insulators, and a control gate disposed on the floating gates via an intergate insulator. The device further includes first diffusion suppressing layers formed inside the respective device regions to divide each of the device regions into an upper device region and a lower device region. The device further includes second diffusion suppressing layers formed on side surfaces of the respective upper device regions, the side surfaces being perpendicular to the second direction.

Another embodiment described herein is, for example, a method of manufacturing a nonvolatile semiconductor memory device, the method including forming a well region in a substrate by implanting impurities into the substrate, and forming a first diffusion suppressing layer in the well region to divide the well region into an upper well region and a lower well region by implanting atoms for suppressing the impurities from diffusing into the well region. The method further includes forming a first insulator on the well region, and forming a first electrode layer on the first insulator. The method further includes forming device regions in the well region by forming isolation trenches that penetrate through the first electrode layer, the first insulator, and the first diffusion suppressing layer, the device regions being defined to extend in a first direction parallel to a principal surface of the substrate, and to be adjacent to one another in a second direction that is perpendicular to the first direction. The method further includes forming second diffusion suppressing layers on side surfaces of the upper well region, the side surfaces being exposed to the isolation trenches and being perpendicular to the second direction. The method further includes burying isolation insulators to isolate the device regions from one another in the isolation trenches, after forming the second diffusion suppressing layers.

Another embodiment described herein is, for example, a method of manufacturing a nonvolatile semiconductor memory device, the method including preparing a substrate including a first semiconductor layer, a first diffusion suppressing layer formed on the first semiconductor layer, and a second semiconductor layer formed on the first diffusion suppressing layer. The method further includes forming a well region in the substrate by implanting impurities into the substrate, the well region including an upper well region located on the first diffusion suppressing layer and a lower well region located under the first diffusion suppressing layer. The method further includes forming a first insulator on the well region, and forming a first electrode layer on the first insulator. The method further includes forming device regions in the well region by forming isolation trenches that penetrate through the first electrode layer, the first insulator, and the first diffusion suppressing layer, the device regions being defined to extend in a first direction parallel to a principal surface of the substrate, and to be adjacent to one another in a second direction that is perpendicular to the first direction. The method further includes forming second diffusion suppressing layers on side surfaces of the upper well region, the side surfaces being exposed to the isolation trenches and being perpendicular to the second direction. The method further includes burying isolation insulators to isolate the device regions from one another in the isolation trenches, after forming the second diffusion suppressing layers.

First Embodiment

FIG. 1 is a plan view showing a structure of a nonvolatile semiconductor memory device according to a first embodiment. The nonvolatile semiconductor memory device of FIG. 1 is an NAND nonvolatile memory.

In the memory cell array of the nonvolatile semiconductor memory device of this embodiment, cell transistors 201 and select transistors 202 are arranged in a two-dimensional array on a substrate 101, as shown in FIG. 1. FIG. 1 shows an X-direction and a Y-direction that are parallel to the principal surface of the substrate 101, and are perpendicular to each other. The X-direction corresponds to the channel width direction of those transistors, and the Y-direction corresponds to the gate length direction of those transistors. FIG. 1 further shows a Z-direction that is perpendicular to the principal surface of the substrate 101, and corresponds to the depth direction of the substrate 101.

In the memory cell array shown in FIG. 1, a well region 102 is formed in the substrate 101, and device regions 103 are formed in the well region 102. The device regions 103 are defined so as to extend in the Y-direction and be adjacent to one another in the X-direction in the well region 102. The Y-direction is an example of a first direction of the disclosure, and the X-direction is an example of a second direction of the disclosure. The device regions 103 are also called active areas (AA). The cell transistors 201 and the select transistors 202 are disposed on the device regions 103, as shown in FIG. 1.

FIG. 1 further shows isolation insulators 104 that are disposed in the well region 102 to isolate the device regions 103 from one another. The isolation insulators 104 of this embodiment are shallow trench isolation (STI) insulators.

FIG. 1 further shows word lines $WL_1$ to $WL_N$ (N being an integer of 2 or greater) that extend in the X-direction, and select lines $SL_1$ and $SL_2$ that extend in the X-direction. In this embodiment, control gates of the cell transistors 201 are processed into shapes that extend in the X-direction to form the word lines $WL_1$ to $WL_N$. Similarly, control gates of the select transistors 202 are processed into shapes that extend in the X-direction to form the select lines $SL_1$ and $SL_2$.

FIG. 1 further shows bit lines $BL_1$ to $BL_3$ that extend in the Y-direction. As shown in FIG. 1, the cell transistors 201 are provided at the respective intersection points between the word lines $WL_1$ to $WL_N$ and the device regions 103, and the select transistors 202 are provided at the respective intersection points between the select lines $SL_1$ and $SL_2$ and the device regions 103.

On the respective device regions 103, NAND strings include the select transistors 202 and the cell transistors 201 sandwiched between the select transistors 202. In FIG. 1, the memory cell array includes plural NAND strings disposed in the X-direction.

Figure 2:
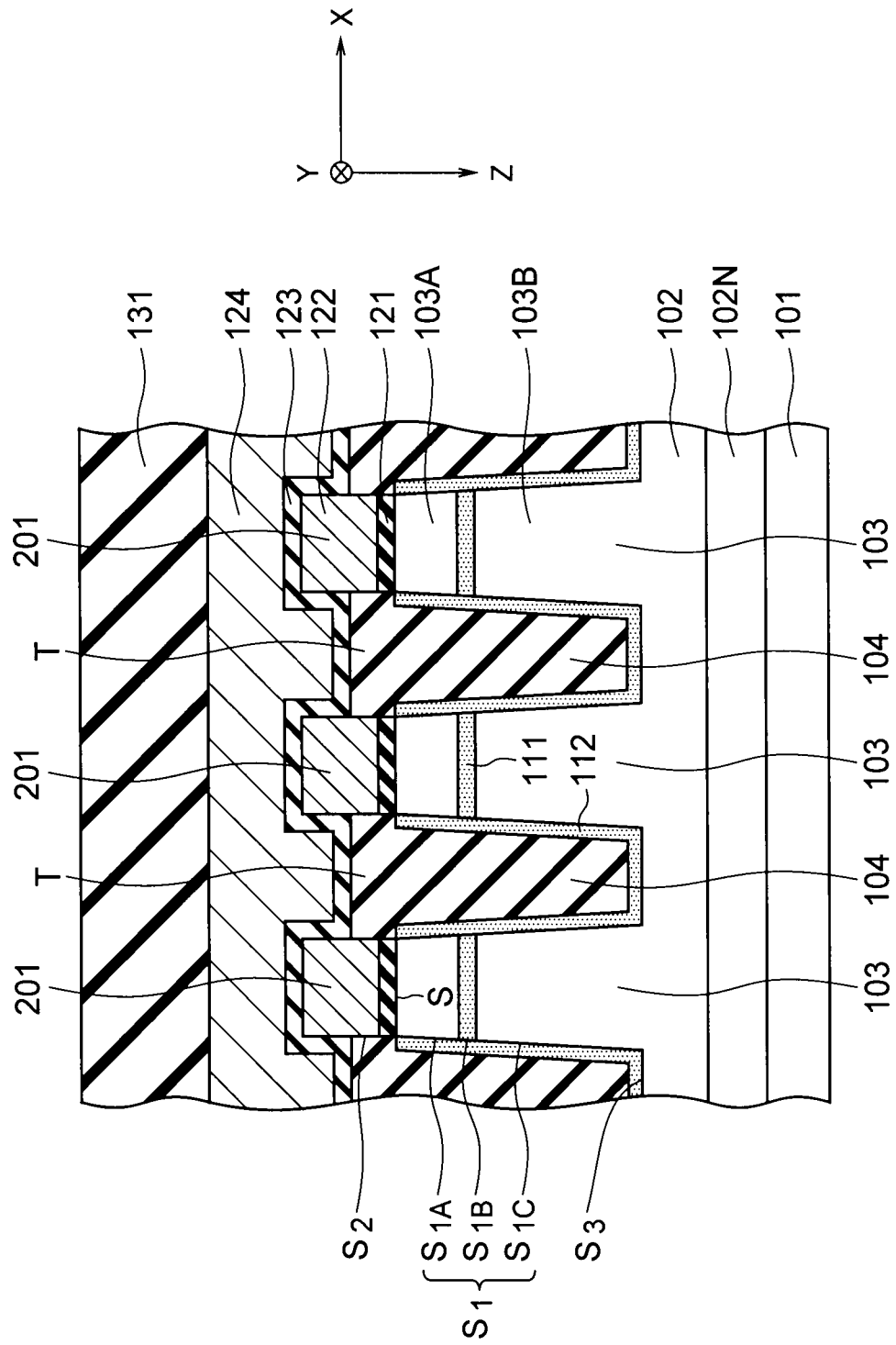
FIGS. 2 and 3 are sectional side views showing sections of the nonvolatile semiconductor memory device of FIG. 1.

FIG. 2 is a sectional side view showing a section of the nonvolatile semiconductor memory device of FIG. 1. FIG. 2 is an AA (Active Area) sectional view of the nonvolatile semiconductor memory device, taken along the line I-I' of FIG. 1. The section shown in FIG. 2 is parallel to the X-direction.

Similarly to FIG. 1, FIG. 2 shows the substrate 101, the well region 102, the device regions 103, and the isolation insulators 104. In this embodiment, the substrate 101 is a semiconductor substrate, or more particularly, a silicon substrate. The well region 102 in this embodiment is a p-type well having p-type impurities implanted therein. The p-type impurities are boron (B) in this case. A buried well region 102N is formed between the substrate 101 and the well region 102. The buried well region 102N in this embodiment is an n-type well having n-type impurities implanted therein. The n-type impurities are phosphorus (P), for example.

FIG. 2 further shows isolation trenches T formed in the well region 102. By the isolation trenches T, the device regions 103 are defined so as to extend in the Y-direction and be adjacent to one another in the X-direction in the well region 102. The isolation insulators 104 are buried in the isolation trenches T to isolate the device regions 103 from one another.

Similarly to FIG. 1, FIG. 2 further shows the cell transistors 201 disposed on the device regions 103.

Each of the cell transistors 201 includes a gate insulator 121, a floating gate 122, an intergate insulator 123, and a control gate 124. The floating gate 122 is disposed on the device region 103 via the gate insulator 121. The control gate 124 is disposed on the floating gate 122 via the intergate insulator 123. The gate insulator 121 is also called a tunnel insulator, and the intergate insulator 123 is also called an inter Poly-Si dielectric (IPD) film.

While the gate insulators 121 and the floating gates 122 are provided for the respective cell transistors 201, the intergate insulator 123 and the control gate 124 are shared among the cell transistors 201 adjacent to one another in the X-direction. In this embodiment, the upper surfaces of the isolation insulators 104 are lower than the upper surfaces of the floating gates 122, as shown in FIG. 2. As a result, the lower surfaces of portions of the intergate insulator 123 located on the isolation insulators 104 are lower than the lower surfaces of portions of the intergate insulator 123 located on the floating gates 122. Similarly, the lower surfaces of portions of the control gate 124 located above the isolation insulators 104 are lower than the lower surfaces of portions of the control gate 124 located above the floating gates 122.

FIG. 2 further shows an inter layer dielectric 131 disposed to cover the cell transistors 201 above the substrate 101. The inter layer dielectric 131 is a silicon oxide film, for example.

FIG. 2 further shows first diffusion suppressing layers 111 and second diffusion suppressing layers 112 that suppress the impurities implanted in the well region 102 from diffusing.

As shown in FIG. 2, the first diffusion suppressing layers 111 are formed in the device regions 103 to divide the device regions 103 into upper device regions 103A and lower device regions 103B. With this arrangement, the impurities contained in the upper device regions 103A are suppressed from diffusing into the first diffusion suppressing layers 111 and the lower device regions 103B, and the impurities contained in the lower device regions 103B are also suppressed from diffusing into the first diffusion suppressing layers 111 and the upper device regions 103A.

In FIG. 2, the side surfaces of the device regions 103 that are perpendicular to the X-direction are denoted by $S_1$, and the side surfaces of the upper device regions 103A, the first diffusion suppressing layers 111, and the lower device regions 103B that are perpendicular to the X-direction are denoted by $S_{1A}$, $S_{1B}$, and $S_{1C}$, respectively. Further, the side surfaces of the floating gates 122 that are perpendicular to the X-direction are denoted by $S_2$, and the bottom surfaces of the isolation trenches T are denoted by $S_3$. Further, the surface of the substrate 101 (the upper surfaces of the device regions 103) are denoted by S.

As shown in FIG. 2, the second diffusion suppressing layers 112 are formed on the side surfaces $S_1$ of the device regions 103. More specifically, the second diffusion suppressing layers 112 are formed on the side surfaces $S_{1A}$, $S_{1B}$, and $S_{1C}$ of the upper device regions 103A, the first diffusion suppressing layers 111, and the lower device regions 103B. With this arrangement, the impurities contained in the upper device regions 103A, the first diffusion suppressing regions 111, and the lower device regions 103B are suppressed from diffusing into the isolation insulators 104.

The second diffusion suppressing layers 112 are further formed on the bottom surfaces $S_3$ of the isolation trenches T, as shown in FIG. 2. With this arrangement, the impurities contained in the well region 102 below the isolation trench T can be suppressed from diffusing into the isolation insulators 104.

In FIG. 2, the lower faces of the upper device regions 103A and the side surfaces $S_{1A}$ of the upper device regions 103A are completely surrounded with the first and second diffusion suppressing layers 111 and 112. With this arrangement, the impurities contained in the upper device regions 103A can be suppressed from diffusing outward via the lower surfaces and the side surfaces $S_{1A}$ of the upper device regions 103A. As will be described later, the impurities in the upper device regions 103A are particularly expected to be suppressed from diffusing in this embodiment. Therefore, completely surrounding the lower surfaces and the side surfaces $S_{1A}$ of the upper device regions 103A with the first and second diffusion suppressing layers 111 and 112 is especially beneficial.

In this embodiment, the first and second diffusion suppressing layers 111 and 112 are SiC (silicon carbide) layers, or more specifically, $Si_XC_{1-X}$ (0<X<1) layers. A carbon atom C is one of group IV atoms similarly to a silicon atom Si, but has a smaller atomic size than a silicon atom Si. Accordingly, a SiC layer has a structure in which C atoms are buried between lattices formed by Si atoms. Since the C atoms exist between the lattices, impurity atoms such as B atoms cannot easily enter the lattices. As a result, the impurities in the well region 102 can be suppressed from diffusing into the first and second diffusion suppressing layers 111 and 112, and can be suppressed from diffusing via the first and second diffusion suppressing layers 111 and 112.

In this embodiment, the concentration of C atoms in the SiC layers is within the range of $1.0 \times 10^{18}$ to $1.0 \times 10^{20}$ atoms/$cm^3$, and more preferably, is $1.0 \times 10^{19}$ atoms/$cm^3$. With this arrangement, diffusion of the impurities can be effectively suppressed by the SiC layers in this embodiment.

Figure 3:
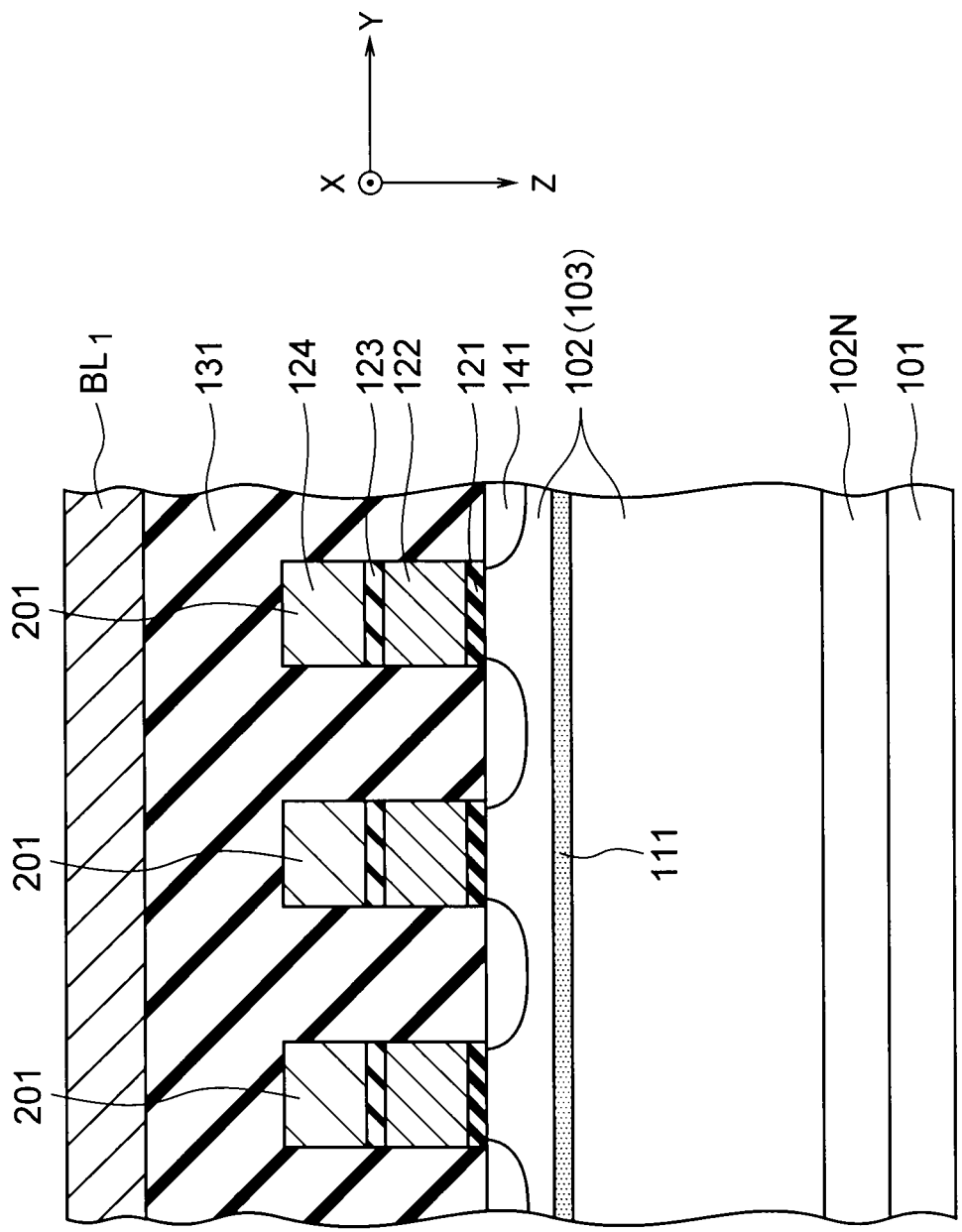

FIG. 3 is a sectional side view showing another section of the nonvolatile semiconductor memory device of FIG. 1. FIG. 3 is a GC (Gate Conductor) sectional view of the nonvolatile semiconductor memory device, taken along the line J-J' of FIG. 1. The section shown in FIG. 3 is parallel to the Y-direction.

Similarly to FIG. 2, FIG. 3 shows the substrate 101, the well region 102, and a first diffusion suppressing layer 111 formed in the well region 102 (device region 103).

FIG. 3 further shows the cell transistors 201 adjacent to one another in the Y-direction, the inter layer dielectric 131 covering the cell transistors 201, and the bit line $BL_1$ disposed on the inter layer dielectric 131. As shown in FIG. 3, the first diffusion suppressing layer 111 is formed continuously below these cell transistors 201. FIG. 3 further shows source and drain regions 141 formed in the well region 102 to sandwich the cell transistors 201.

The depth-directional profile of the impurity concentration (impurity concentration profile) in the device regions 103 shown in FIG. 2 is now described. In FIG. 2, the depth direction is shown as the Z-direction.

Figure 4:
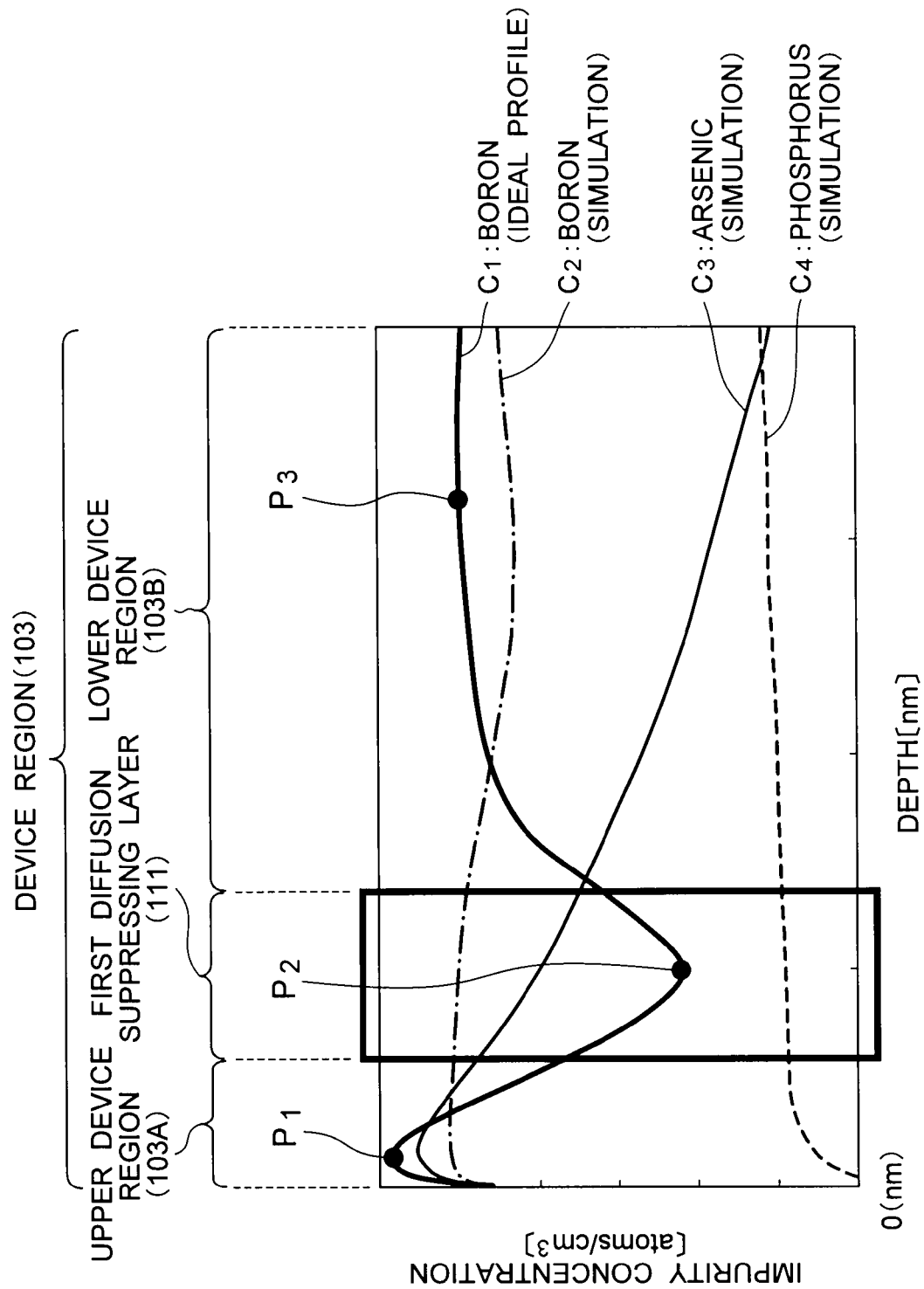
FIG. 4 is a graph showing a depth-directional profile of an impurity concentration in device regions.
Figure 5:
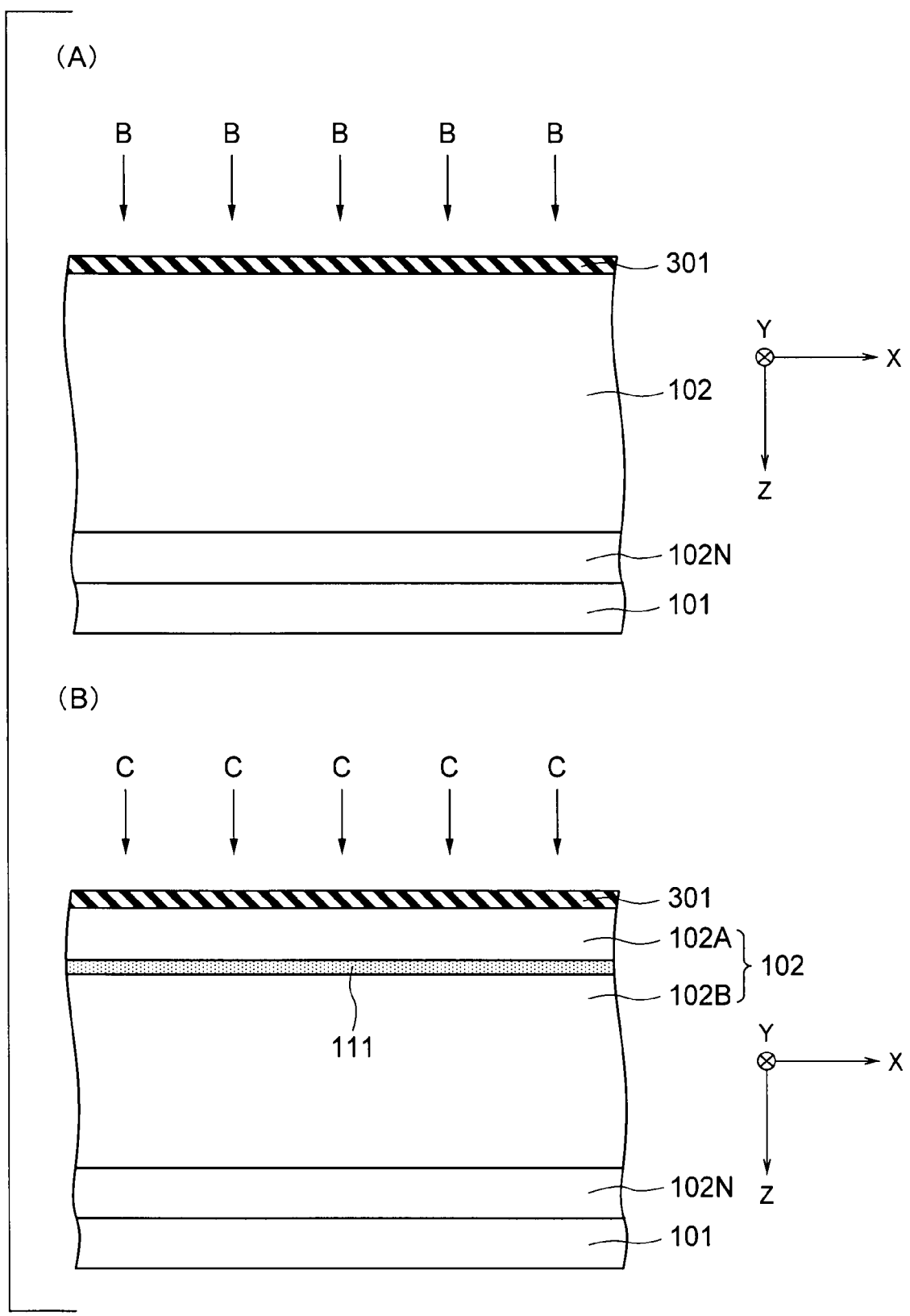
Figure 7:
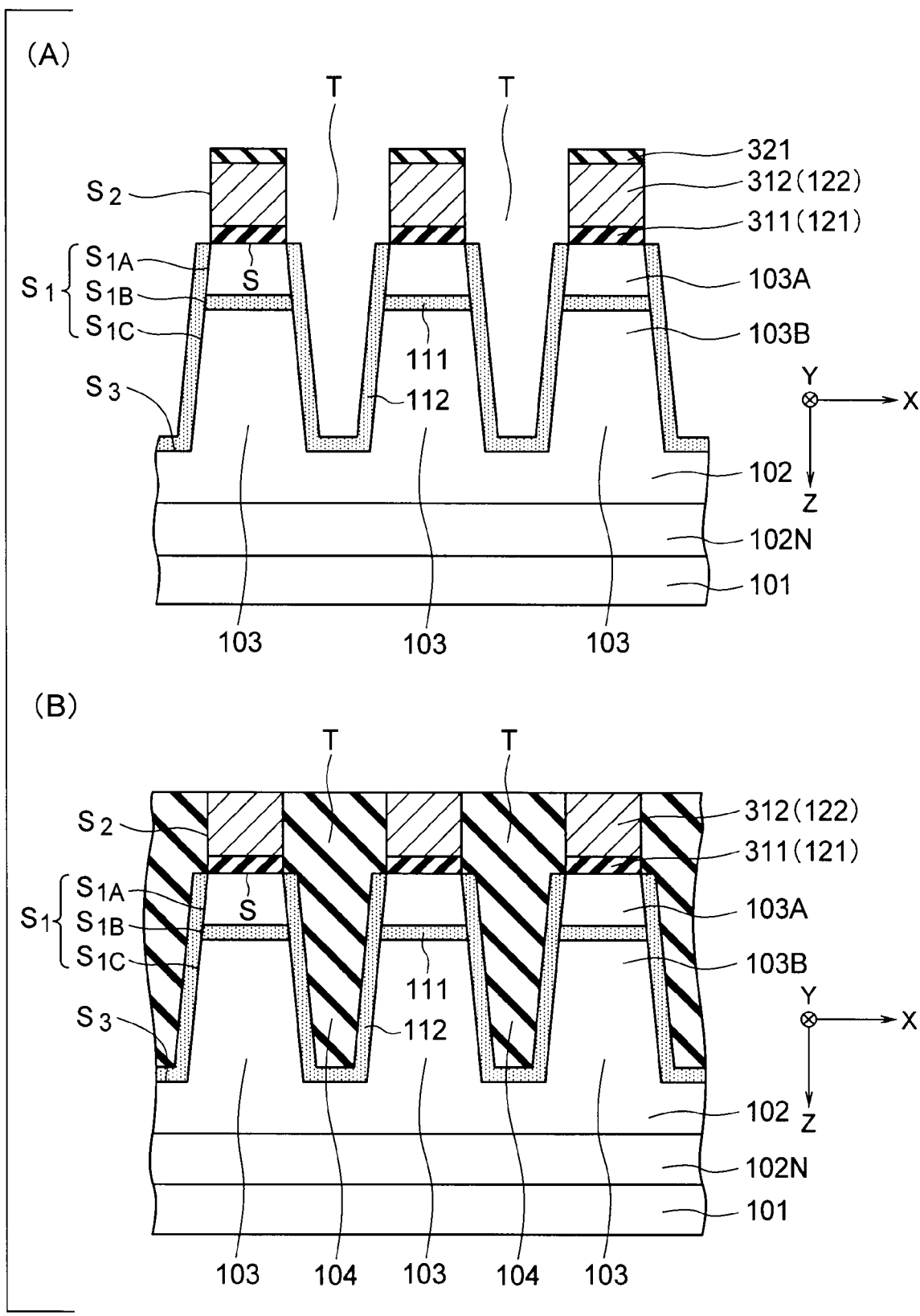
Figure 8:
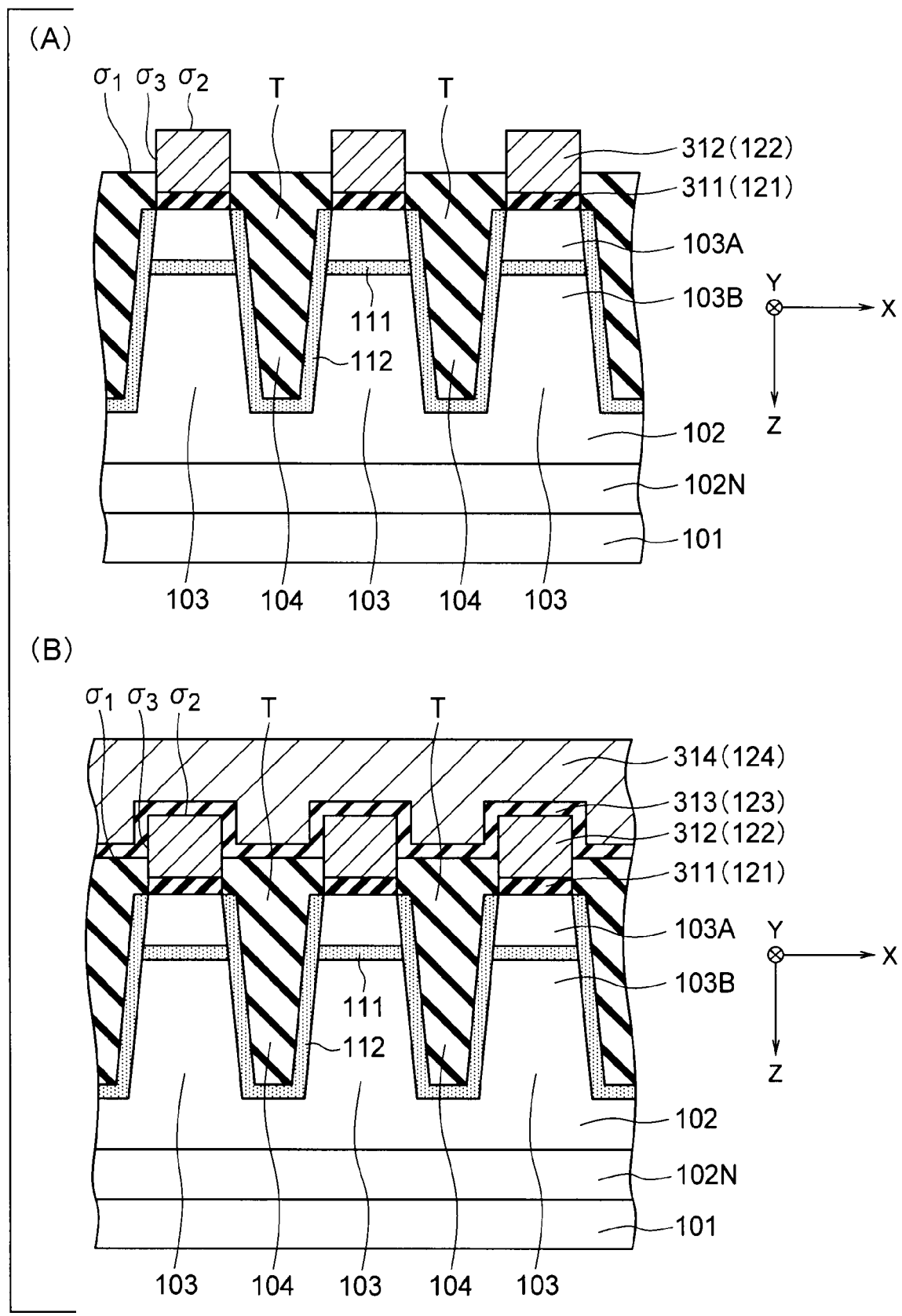

FIG. 4 is a graph showing the depth-directional profile of the impurity concentration in the device regions 103. In FIG. 4, the abscissa axis indicates the depth (nm) from the surface S of the substrate 101, and the ordinate axis indicates the impurity concentration (atoms/$cm^3$) in the device regions 103 on a logarithmic scale.

In this embodiment, the impurities in the device regions 103 are boron atoms (B). In FIG. 4, the ideal profile of the B atom concentration is represented by a curve $C_1$. In FIG. 4, a curve $C_2$ represents the profile of a B atom concentration obtained by simulating a situation where the first and second diffusion suppressing layers 111 and 112 are not formed inside the device regions 103 and on the side surfaces of the device regions 103, with the use of an internally-created simulator. Further, curves $C_3$ and $C_4$ represent the profiles of an arsenic (As) atom concentration and a phosphorus (P) atom concentration obtained through the same simulations as above. Here, "depth" means the depth from the surface S of the substrate 101 (well region 102).

The ideal profile $C_1$ is now described.

As shown in FIG. 4, the ideal profile $C_1$ has two local maximum points $P_1$ and $P_3$, and a local minimum point $P_2$ located in a position between the two local maximum points $P_1$ and $P_3$. More specifically, the ideal profile $C_1$ has the local maximum point $P_1$ in the vicinity of the surface of the substrate 101, or at a point of approximately 10 nm in depth, for example. The ideal profile $C_1$ has the local minimum point $P_2$ in a position slightly deeper than the local maximum point $P_1$, or at a point of approximately 30 to 60 nm in depth (50 nm, for example). The ideal profile $C_1$ further has the local maximum point $P_3$ in a position slightly shallower than the bottom portions of the isolation insulators 104 (i.e., slightly shallower than the bottom surfaces $S_3$ of the isolation trenches T), or at a point of approximately 150 nm in depth, for example.

Such profile has the following advantages.

First, the high impurity concentration in the vicinity of the surface of the substrate 101 effectively suppresses a short-channel effect, and effectively increases the neutral threshold value Vth of the cell transistors 201.

Further, the low impurity concentration in the position slightly deeper than the local maximum point $P_1$ effectively improves the memory boosting efficiency, and effectively reduces writing errors at a writing operation (programming operation). This is because depletion layers extend to regions near the channels of unselected memory cells at the writing operation. As a result, electrons are not injected into the unselected memory cells, and the probability of writing errors becomes lower. The position of the local minimum point $P_2$ can be expressed as a position in which the depletion layers extend to the regions near the channels of the unselected memory cells at the writing operation.

Further, the high impurity concentration in the position slightly shallower than the bottom portions of the isolation insulators 104 effectively suppresses "punch-through" between bit lines (or between the device regions 103). At the writing operation, when the cell transistors 201 of one NAND string are selected and the cell transistors 201 of other NAND strings are unselected, a large potential difference is caused among those NAND strings. If the local maximum point $P_3$ is located in a position deeper than the bottom portions of the isolation insulators 104, there is a higher probability that the depletion layers of the other NAND strings pass beyond the bottom portions of the isolation insulators 104 and spread to the one NAND string. As a result, there is a higher probability that "punch-through" occurs between the NAND strings adjacent to one another in the X-direction. On the other hand, if the local maximum point $P_3$ is located in the position slightly shallower than the bottom portions of the isolation insulators 104, the depletion layers of the other NAND strings hardly pass beyond the bottom portions of the isolation insulators 104. As a result, the depletion layers of the other NAND strings can be prevented from spreading to the adjacent one NAND string, and "punch-through" can be suppressed.

Therefore, in general, when an NAND nonvolatile memory is manufactured, B atoms are normally implanted so that the profile of the B atoms has the ideal profile $C_1$. However, by a conventional manufacture method, the ideal profile $C_1$ deteriorates to the profile $C_2$ due to heating processes carried out in a later stage.

The principal cause of this probably lies in the fact that the B atoms in the vicinity of the local maximum point $P_1$ and the local maximum point $P_3$ diffuse into the vicinity of the local minimum point $P_2$. Particularly, the B atom concentration difference between the local maximum point $P_1$ and the local minimum point $P_2$ is large, although the distance between the two points is relatively short. Therefore, the B atoms easily diffuse from the vicinity of the local maximum point $P_1$ to the vicinity of the local minimum point $P_2$.

To counter this problem, when the nonvolatile semiconductor memory device of FIG. 1 is manufactured in this embodiment, the first diffusion suppressing layers 111 are formed in positions including the point of 50 nm in depth, for example, as shown in FIG. 4. In this embodiment, by virtue of the first diffusion suppressing layers 111, the device regions 103 are divided into the upper device regions 103A including the vicinity of the surface of the substrate 101, and the lower device regions 103B including positions slightly shallower than the bottom portions of the isolation insulators 104.

In this embodiment, by virtue of the first diffusion suppressing layers 111, the B atoms in the upper device regions 103A and the lower device regions 103B are suppressed from diffusing into the first diffusion suppressing layers 111. Further, the B atoms in the upper device regions 103A are suppressed from diffusing into the lower device regions 103B, and the B atoms in the lower device regions 103B are suppressed from diffusing into the upper device regions 103A. Accordingly, in this embodiment, the ideal profile $C_1$ can be suppressed from deteriorating due to heating processes.

In this embodiment, the second diffusion suppressing layers 112 are further formed on the side surfaces $S_{1A}$, $S_{1B}$, and $S_{1C}$ of the upper device regions 103A, the first diffusion suppressing layers 111, and the lower device regions 103B (see FIG. 2), as described above. With this arrangement, the B atoms in those regions and layers are suppressed from diffusing into the isolation insulators 104, and deterioration of the ideal profile $C_1$ due to the heating processes can be further suppressed. The second diffusion suppressing layers 112 formed on the bottom surfaces $S_3$ of the isolation trenches T also contribute to such an effect.

In this embodiment, the lower surfaces and the side surfaces $S_{1A}$ of the upper device regions 103A are completely surrounded with the first and second diffusion suppressing layers 111 and 112 (see FIG. 2), as described above. In the ideal profile $C_1$, the B atom concentration in the vicinity of the local maximum point $P_1$ is higher than the B atom concentration in the vicinity of the local minimum point $P_2$ (and even in the vicinity of the local maximum point $P_3$). Also, the B atom concentration difference between the local maximum point $P_1$ and the local minimum point $P_2$ is large, though the distance between the local maximum point $P_1$ and the local minimum point $P_2$ is relatively short. Accordingly, the B atoms easily diffuse from the upper device regions 103A into the first diffusion suppressing layers 111 and the isolation insulators 104.

Therefore, the lower surfaces and the side surfaces $S_{1A}$ of the upper device regions 103A are surrounded with the first and second diffusion suppressing layers 111 and 112, to suppress diffusion of the B atoms from the upper device regions 103A in this embodiment. With this arrangement, the ideal profile $C_1$ can be suppressed from deteriorating due to diffusion of the B atoms from the upper device regions 103A.

Referring now to FIG. 4, the advantages of forming the first and second diffusion suppressing layers 111 and 112 in the device regions 103 and on the side surfaces of the device regions 103 are described in greater detail.

In the case where the nonvolatile semiconductor memory device of FIG. 1 is manufactured in this embodiment, the first diffusion suppressing layers 111 are formed in positions including points of approximately 50 nm in depth. With this arrangement, the B atoms are suppressed from diffusing into the vicinity of the local minimum point $P_2$ due to the heating processes. As a result, in this embodiment, the memory boosting efficiency is improved, and writing errors at the writing operation are reduced.

In this embodiment, by the first diffusion suppressing layers 111, the device regions 103 are divided into the upper device regions 103A including points of 10 nm in depth, and the lower device regions 103B including points slightly shallower than the bottom portions of the isolation insulators 104.

With this arrangement, the B atoms in the upper device regions 103A are suppressed from diffusing into the first diffusion suppressing layers 111 (and further into the lower device regions 103B). As a result, a short-channel effect is suppressed, and the neutral threshold value Vth of the cell transistors 201 is improved in this embodiment.

Furthermore, the B atoms in the lower device regions 103B are suppressed from diffusing into the first diffusion suppressing layers 111 (and further into the upper device regions 103A). As a result, punch-through between the adjacent NAND strings can be suppressed at the writing operation in this embodiment.

As described above, in this embodiment, the first and second diffusion suppressing layers 111 and 112 are formed in the device regions 103 and on the side surfaces of the device regions 103, so that the profile of the impurity concentration in the device regions 103 can be suppressed from deviating from the ideal profile $C_1$.

Accordingly, this embodiment enables to manufacture a nonvolatile semiconductor memory device in which the B atom concentration in the first diffusion suppressing layers 111 is lower than the B atom concentration in the upper device regions 103A and the B atom concentration in the lower device regions 103B. With such an impurity concentration profile, the memory boosting efficiency is improved, writing errors at the writing operation are reduced, a short-channel effect is suppressed, the neutral threshold value Vth of the cell transistors 201 is improved, and punch-through between the bit lines is suppressed, as described above.

More specifically, in the above impurity concentration profile, the B atom concentration in the vicinity of the first diffusion suppressing layers 111 is lower than the B atom concentration in the vicinity of the gate insulators 121 in the upper device regions 103A, and the B atom concentration in the positions of the slightly shallower than the bottom portions of the isolation insulators 104 in the lower device regions 103B. Where the point in each lower device region 103B at substantially the same height as the bottom portion of each isolation insulator 104 is called the bottom point, the positions in the lower device regions 103B slightly shallower than the bottom portions of the isolation insulators 104 can be referred to as points that are higher than the bottom points but are in the vicinity of the bottom points.

In this embodiment, the first and second diffusion suppressing layers 111 and 112 are SiC layers, as described above. The C atoms suppress the B atoms from diffusing, but have only small influence on diffusion of As atoms. Accordingly, the first and second diffusion suppressing layers 111 and 112 formed with SiC layers also have the advantage of having small influence on the As atoms in the cell diffusion layers of the source and drain regions 141 and the likes. This is also beneficial in improving the memory boosting efficiency.

The upper surfaces of the first diffusion suppressing layers 111 are located at a point of approximately 30 nm in depth in FIG. 4, but may be located at some different depths. Similarly, the lower surfaces of the first diffusion suppressing layers 111 are located at a point of approximately 70 nm in depth in FIG. 4, but may be located at some different depths.

Referring now to FIG. 2, the formation positions of the second diffusion suppressing layers 112 are described in greater detail.

As described above, in this embodiment, the lower surfaces and the side surfaces $S_{1A}$ of the upper device regions 103A are surrounded with the first and second diffusion suppressing layers 111 and 112, to suppress diffusion of the B atoms from the upper device regions 103A.

In this embodiment, the second diffusion suppressing layers 112 are preferably designed to cover not only the side surfaces $S_{1A}$ of the upper device regions 103A but also the entire side surfaces $S_1$ of the device regions 103, as shown in FIG. 2. In other words, the second diffusion suppressing layers 112 are preferably designed to be formed not only on the side surfaces $S_{1A}$ of the upper device regions 103A but also on the side surfaces $S_{1B}$ and $S_{1C}$ of the first diffusion suppressing layers 111 and the lower device regions 103B. With this arrangement, the B atoms can be suppressed from diffusing into the isolation insulators 104 from the device regions 103, and the punch-through pressure resistance and the cutoff characteristics of the cell transistors 201 can be improved.

In this embodiment, the second diffusion suppressing layers 112 are formed only on the side surfaces $S_1$ of the device regions 103 among the side surfaces $S_1$ and $S_2$ of the device regions 103 and the floating gates 122, as shown in FIG. 2. As a result, the intergate insulator 123 is disposed in direct contact with the side surfaces $S_2$ of the floating gates 122. Accordingly, the coupling ratio in the cell transistors 201 is not lowered, which is advantageous.

In the following, a method of manufacturing the nonvolatile semiconductor memory device according to the first embodiment is described.

FIGS. 5 to 8 show sectional side views for explaining the method of manufacturing the nonvolatile semiconductor memory device according to the first embodiment. Each of the sectional side views shown in FIGS. 5(A) to 8(B) is an AA sectional view of the nonvolatile semiconductor memory device, taken along the line I-I' of FIG. 1.

A sacrifice layer 301 is formed on the substrate 101 (FIG. 5(A)). The substrate 101 in this example is a semiconductor substrate, or more particularly, a silicon substrate. Impurities are then implanted into the substrate 101 to form the well region 102 in the substrate 101 (FIG. 5(A)). The impurities in this example are p-type impurities, or more particularly, boron (B) atoms. Further, impurities are implanted into the substrate 101 to form the buried well region 102N in the substrate 101 (FIG. 5(A)). The impurities in this example are n-type impurities, or more particularly, phosphorus (P) atoms, for example.

Atoms (carbon atoms C in this example) for suppressing the diffusion of the impurities are then implanted into the well region 102 (FIG. 5(B)). As a result, a first diffusion suppressing layer 111 is formed in the well region 102, to divide the well region 102 into an upper well region 102A and a lower well region 102B (FIG. 5(B)). The first diffusion suppressing layer 111 is crystallized through various annealing processes carried out later.

In the procedure of FIG. 5(A), the implantation of the B atoms is performed so that the profile of the B atoms becomes the ideal profile $C_1$ shown in FIG. 4. In the procedure of FIG. 5(B), the implantation of the C atoms is performed so that a point of approximately 50 nm in depth from the surface of the substrate 101 becomes a peak of the C atom concentration (a local maximum point). With this arrangement, the first diffusion suppressing layer 111 is formed in a position including the point of 50 nm in depth from the surface of the substrate 101.

After the sacrifice layer 301 is removed, a first insulator 311 that is to be the gate insulators 121 is formed on the well region 102 (FIG. 6(A)). A first electrode layer 312 that is to be the floating gates 122 is then formed on the first insulator 311 (FIG. 6(A)). The first electrode layer 312 in this example is a polysilicon layer. A mask layer 321 to be hard masks is then formed on the first electrode layer 312 (FIG. 6(A)).

The isolation trenches T penetrating through the mask layer 321, the first electrode 312, the first insulator 311, and the first diffusion suppressing layer 111 are formed by lithography and RIE (Reactive Ion Etching) (FIG. 6(B)). By forming the isolation trenches T, the device regions 103 that extend in the Y-direction and are adjacent to one another in the X-direction are formed in the well region 102 (FIG. 6(B)).

The isolation trenches T are designed to have the bottom surfaces $S_3$ at a height between the upper face and the lower face of the lower well region 102B. As a result, the lower well region 102A remaining after forming the isolation trenches T turns into the upper device regions 103A, and upper portions of the lower well region 102B remaining after forming the isolation trenches T turns into the lower device regions 103B, as shown in FIG. 6(B).

FIG. 6(B) shows the side surfaces $S_1$ of the device regions 103, and the side surfaces $S_2$ of the first electrode layers 312. The side surfaces $S_1$ and $S_2$ are exposed to the isolation trenches T and are perpendicular to the X-direction. FIG. 6(B) further shows the side surfaces $S_{1A}$, $S_{1B}$, and $S_{1C}$ of the upper device regions 103A, the first diffusion suppressing layers 111, and the lower device regions 103B that are perpendicular to the X-direction.

Processing is performed to form the second diffusion suppressing layers 112 on the side surfaces $S_{1A}$ of the upper device regions 103A. In this embodiment, the second diffusion suppressing layers 112 are formed through selective growth (SEG). As a result, the second diffusion suppressing layers 112 are formed to cover the entire side surfaces $S_1$ of the device regions 103 and the entire bottom surfaces $S_3$ of the isolation trenches T (FIG. 7(A)).

Since the second diffusion suppressing layers 112 are formed through SEG in this embodiment, the second diffusion suppressing layers 112 are selectively formed only on the side surfaces $S_1$ of the device regions 103 among the side surfaces $S_1$ of the device regions 103 and the side surfaces $S_2$ of the first electrode layers 312 (FIG. 7(A)). This arrangement has an advantage that the intergate insulator 123 is formed in contact with the side surfaces $S_2$ of the floating gates 122, and the coupling ratio in the cell transistors 201 is not lowered, as will be described later.

In this embodiment, the second diffusion suppressing layers 112 have such a thickness that the isolation trenches T are not completely buried. This is because the device regions 103 cannot be isolated from one another unless the isolation insulators 104 are buried in the isolation trenches T. In this embodiment, the second diffusion suppressing layers 112 are SiC layers. In this embodiment, the first and second diffusion suppressing layers 111 and 112 formed in the above manner can suppress the B atoms from diffusing due to various heating processes carried out later.

After forming the second diffusion suppressing layers 112, the isolation insulators 104 for isolating the device regions 103 from one another are buried in the isolation trenches T (FIG. 7(B)). The isolation insulators 104 are formed by depositing the material of the isolation insulators 104 on the entire surface of the substrate 101, and planarizing the material by chemical mechanical polishing (CMP) by using the mask layers 321 as stoppers. The mask layers 321 are removed by RIE, which is performed after the CMP (FIG. 7(B)).

Etching is then performed on the isolation insulators 104, so that the upper surfaces $\sigma_1$ of the isolation insulators 104 become lower than the upper surfaces $\sigma_2$ of the first electrode layers 312 (FIG. 8(A)). Through the etching, the side surfaces of the first electrode layers 312 that are perpendicular to the X-direction are partially exposed. In FIG. 8(A), the exposed side surfaces of the first electrode layers 312 are denoted by $\sigma_3$.

A second insulator 313 to be the intergate insulator 123 is then formed on the first electrode layers 312 and the isolation insulators 104 (FIG. 8(B)). A second electrode layer 314 to be the control gate 124 is then formed on the second insulator 313 (FIG. 8(B)). The second electrode layer 314 in this example is a polysilicon layer.

In this embodiment, the upper surfaces $\sigma_1$ of the isolation insulators 104 are lower than the upper surfaces $\sigma_2$ of the first electrode layers 312 due to the etching process illustrated in FIG. 8(A).

As a result, the lower surfaces of portions of the second insulator 313 located above the isolation insulators 104 are lower than the lower surfaces of portions of the second insulator 313 located on the first electrode layers 312. The second insulator 313 is formed in contact with the upper surfaces $\sigma_2$ and the exposed side surfaces $\sigma_3$ of the first electrode layers 312. The lower surfaces of portions of the second electrode layer 314 located above the isolation insulators 104 become lower than the lower surfaces of portions of the second electrode layer 314 located above the first electrode layers 312.

As described above, in this embodiment, the second insulator 313 is formed in direct contact with the exposed side surfaces $\sigma_3$ of the first electrode layers 312, and accordingly, the distance between the first electrode layers 312 and the second electrode layer 314 becomes shorter. In this manner, the coupling ratio in the cell transistors 201 (FIG. 2) is improved in this embodiment.

Further, the following procedures are carried out in this embodiment, i.e., the gate processing of the first insulators 311, the first electrode films 312, the second insulator 313, and the second electrode layer 314, the formation of the source and drain regions 141 (FIG. 3), the formation of various inter layer dielectrics, contact plugs, and interconnect layers, and the likes. In this manner, the nonvolatile semiconductor memory device of this embodiment is manufactured.

Figure 9:
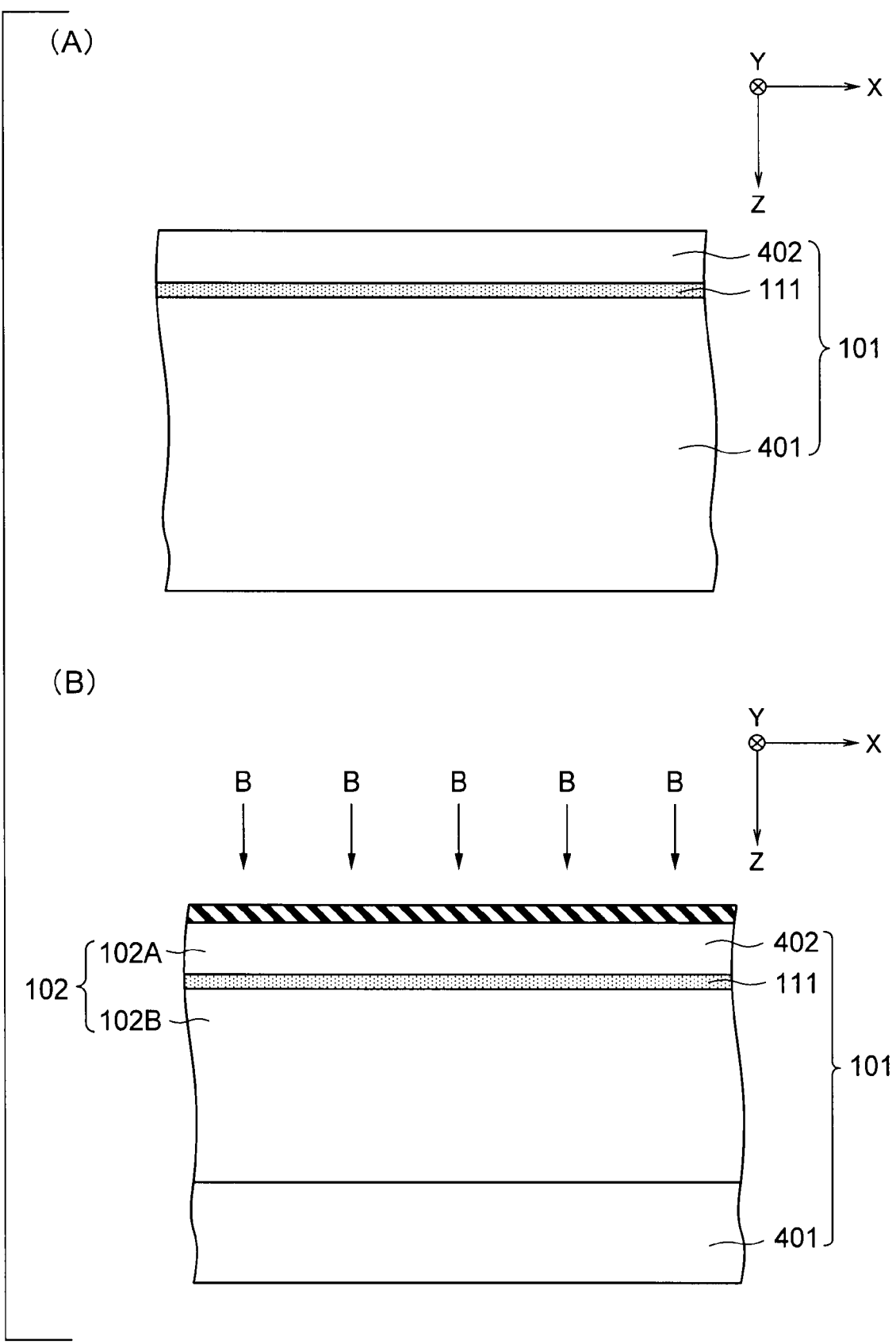
FIG. 9 shows sectional side views for explaining a modification of the method of manufacturing the nonvolatile semiconductor memory device of the first embodiment.

FIG. 9 shows sectional side views for explaining a modification of the method of manufacturing the nonvolatile semiconductor memory device of the first embodiment. Each of the sectional side views of FIGS. 9(A) and 9(B) is an AA sectional view.

A first diffusion suppressing layer 111 is formed by crystal growth on a semiconductor substrate 401 (FIG. 9(A)). The semiconductor substrate 401 in this modification is a silicon substrate, and the first diffusion suppressing layer 111 in this modification is a SiC layer. The semiconductor substrate 401 is an example of the first semiconductor layer of the disclosure.

A semiconductor layer 402 is then formed on the first diffusion suppressing layer 111 (FIG. 9(A)). The semiconductor layer 402 in this modification is a silicon layer. The semiconductor layer 402 is an example of the second semiconductor layer of the disclosure.

In this manner, a substrate is formed by stacking the semiconductor substrate 401, the first diffusion suppressing layer 111, and the semiconductor layer 402. This substrate is equivalent to the substrate 101 shown in FIG. 2.

A sacrifice layer 301 is then formed on the substrate 101 (FIG. 9(B)). Impurities are then implanted into the substrate 101 to form the well region 102 in the substrate 101 (FIG. 9(B)). The well region 102 is formed to have a bottom face lower than the lower face of the first diffusion suppressing layer 111. With this arrangement, the well region 102 is designed to include an upper well region 102A located on the first diffusion suppressing layer 111, and a lower well region 102B located under the first diffusion suppressing layer 111 (FIG. 9(B)). The impurities in this modification are p-type impurities, or more particularly, boron (B) atoms. Although the buried well region 102N is also formed in this modification, explanation of it is omitted herein, since the formation of it is the same as in the method of manufacturing the nonvolatile semiconductor memory device of the first embodiment (FIGS. 5 to 8).

In the procedure of FIG. 9(A), the first diffusion suppressing layer 111 and the semiconductor layer 402 are formed so that the first diffusion suppressing layer 111 includes a point of approximately 50 nm in depth from the surface of the substrate 101. In the procedure of FIG. 9(B), the implantation of B atoms is performed so that the profile of the B atoms becomes the ideal profile $C_1$ shown in FIG. 4. With this arrangement, the local minimum point $P_2$ of the ideal profile $C_1$ is formed in the first diffusion suppressing layer 111.

The procedures illustrated in FIGS. 6(A) to 8(B) are carried out in this modification. In this manner, the nonvolatile semiconductor memory device of this modification is manufactured. As described above, the first diffusion suppressing layers 111 can be prepared by forming a SiC layer through crystal growth, not only by implanting C atoms.

As described above, in this embodiment, the first diffusion suppressing layers 111 to suppress impurity diffusion are formed in the device regions 103, to divide the device regions 103 into the upper device regions 103A and the lower device regions 103B. Further, the second diffusion suppressing layers 112 are formed on the side surfaces $S_{1A}$ of the upper device regions 103A that are perpendicular to the X-direction.

With this arrangement, the impurities in the upper device regions 103A can be suppressed from diffusing into the first diffusion suppressing layers 111 (and further into the lower device regions 103B), and diffusing into the isolation insulators 104. Furthermore, the impurities in the lower device regions 103B can be suppressed from diffusing into the first diffusion suppressing layers 111 and the upper device regions 103A. Further, it is possible to reduce the dose loss due to outdiffusion of the impurities in various heating processes performed after the formation of the first and second diffusion suppressing layers 111 and 112.

Also, in this embodiment, the second diffusion suppressing layers 112 are formed not only on the side surfaces $S_{1A}$ of the upper device regions 103A, but also on the side surfaces $S_{1B}$ and $S_{1C}$ of the first diffusion suppressing layers 111 and the lower device regions 103B. With this arrangement, the impurity diffusion from the device regions 103 into the isolation insulators 104 can be suppressed, and the punch-through pressure resistance of the nonvolatile semiconductor memory device can be improved.

Also, in this embodiment, the second diffusion suppressing layers 112 are formed only on the side surfaces $S_1$ of the device regions 103 among the side surfaces $S_1$ and $S_2$ of the device regions 103 and the floating gates 122 that are perpendicular to the X-direction. With this arrangement, the intergate insulator 123 can be formed in contact with the side surfaces $S_2$ of the floating gates 122, and the coupling ratio in the cell transistors 201 is not lowered, unlike the coupling ratio lowered in a case where the second diffusion suppressing layers 112 exist on the side surfaces $S_2$.

Also, in this embodiment, the second diffusion suppressing layers 112 are formed through SEG. Accordingly, the second diffusion suppressing layers 112 can be selectively formed only on the side surfaces $S_1$ of the device regions 103 among the side surfaces $S_1$ and $S_2$ of the device regions 103 and the floating gates 122.

In this embodiment, the above described first and second diffusion suppressing layers 111 and 112 suppress the profile of the impurity concentration in the device regions 103 from deviating from the ideal profile.

Accordingly, this embodiment enables to manufacture a nonvolatile semiconductor memory device in which the impurity concentration in the first diffusion suppressing layers 111 is lower than the impurity concentration in the upper device regions 103A and the impurity concentration in the lower device regions 103B. With such an impurity concentration profile, the following effects can be achieved, i.e., the boosting efficiency of the nonvolatile semiconductor memory device is improved, writing errors at the writing operation are reduced, a short-channel effect is suppressed, the neutral threshold value Vth of the cell transistors 201 is improved, and punch-through among adjacent NAND strings at the writing operation is suppressed, for example.

In the following, second to fifth embodiments are described. Those embodiments are modifications of the first embodiment, and the aspects of those embodiments different from the first embodiment are mainly described. The structure illustrated in FIG. 1 is a common structure among the first to fifth embodiments.

Second Embodiment

Figure 10:
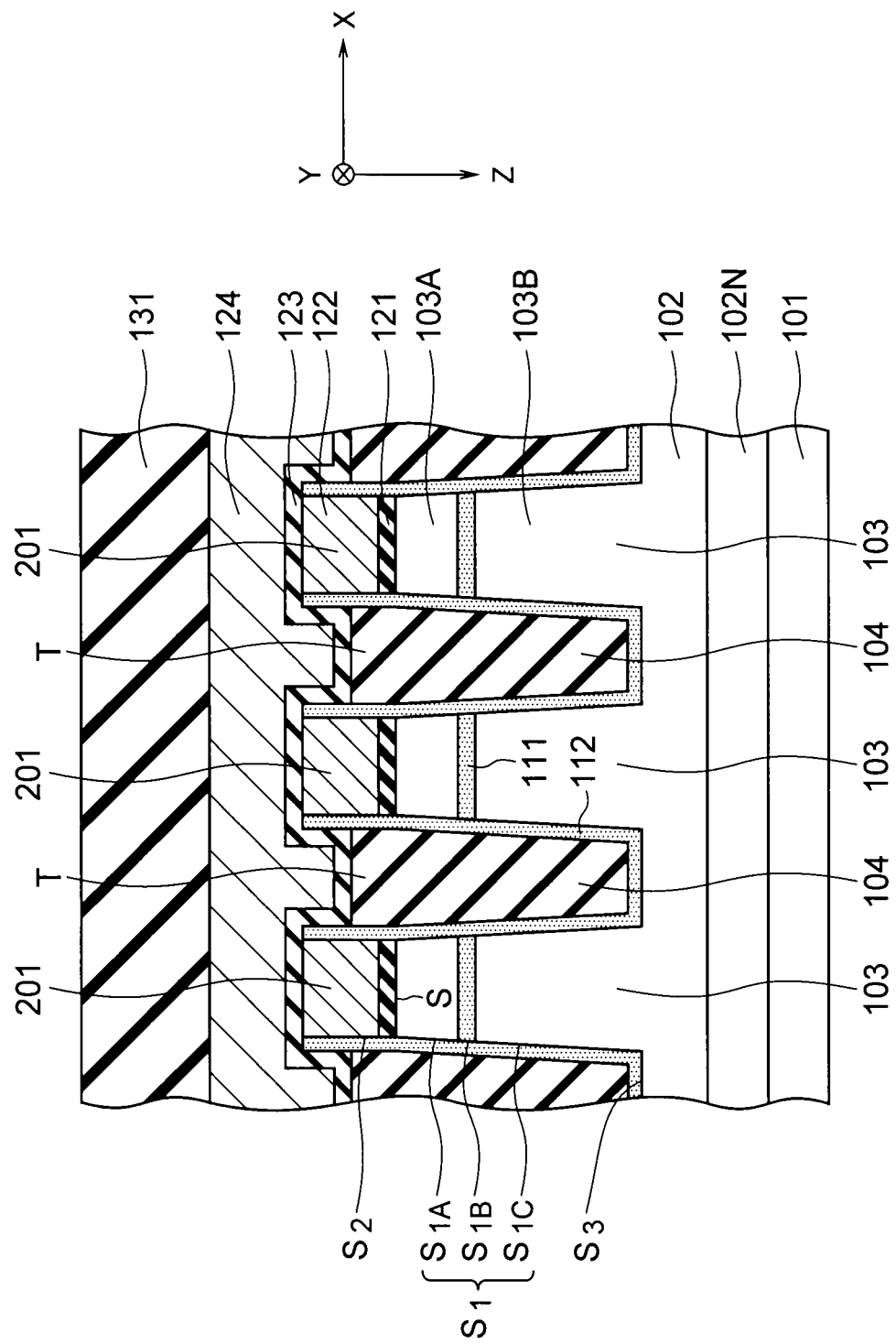
FIG. 10 is a sectional side view showing a structure of a nonvolatile semiconductor memory device according to a second embodiment.

FIG. 10 is a sectional side view showing a structure of a nonvolatile semiconductor memory device according to a second embodiment. FIG. 10 is an AA sectional view, taken along the line I-I' of FIG. 1.

In the first embodiment, the second diffusion suppressing layers 112 are formed only on the side surfaces $S_1$ of the device regions 103 among the side surfaces $S_1$ and $S_2$ of the device regions 103 and the floating gates 122, as shown in FIG. 2. As a result, the intergate insulator 123 is disposed in contact with the side surfaces $S_2$ of the floating gates 122.

In the second embodiment, on the other hand, the second diffusion suppressing layers 112 are formed continuously on the side surfaces $S_1$ and $S_2$ of the device regions 103 and the floating gates 122. As a result, the intergate insulator 123 is disposed on the side surfaces $S_2$ of the floating gates 122 via the second diffusion suppressing layers 112. Such a structure has the advantage that formation of a bird's beak can be prevented at each edge E between the lower surfaces and the side surfaces $S_2$ of the floating gates 122 when the isolation insulators 104 and the gate insulator 123 are disposed.

In the following, a method of manufacturing the nonvolatile semiconductor memory device according to the second embodiment is described.

Figure 11:
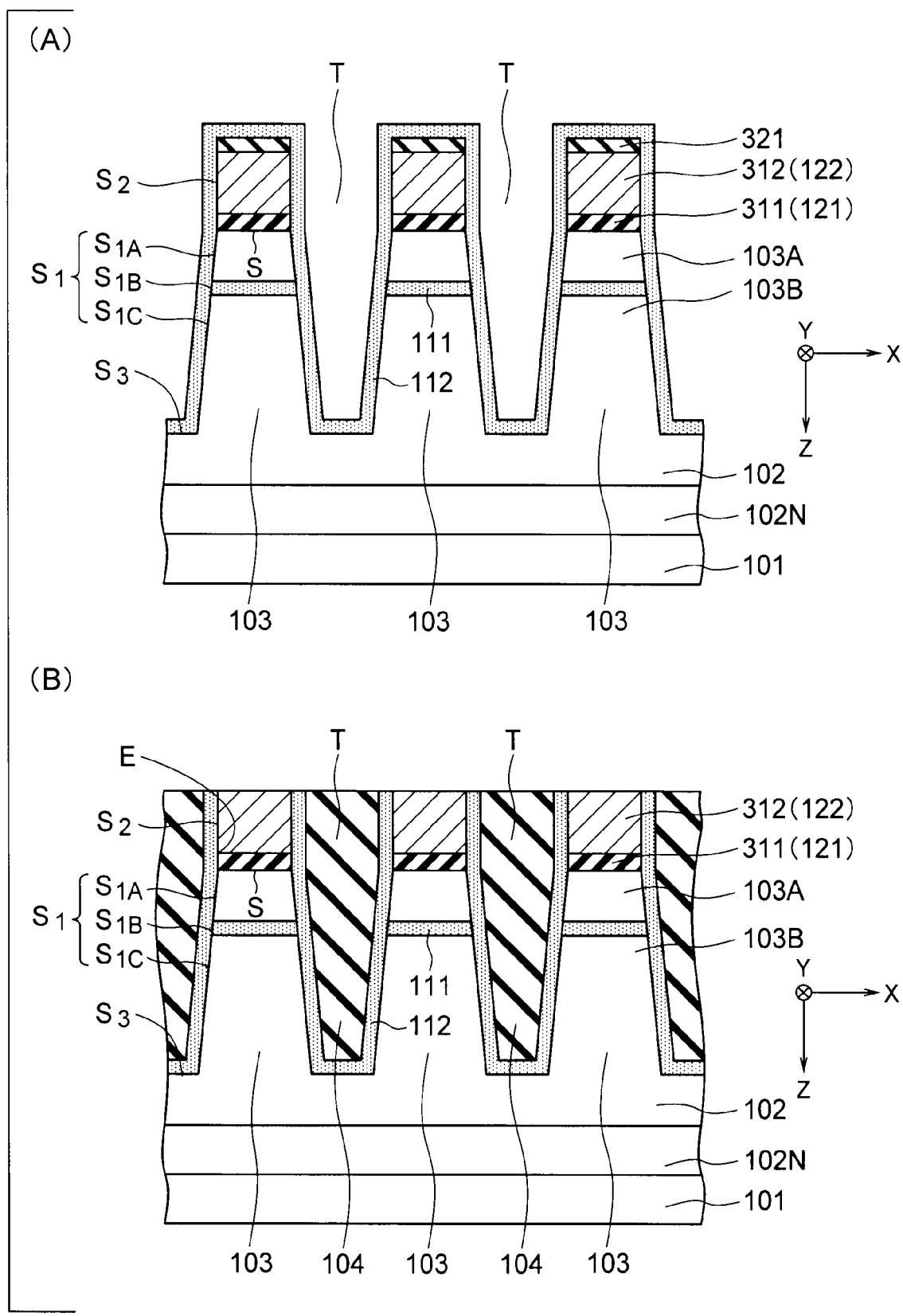
FIGS. 11 to 12 show sectional side views for explaining a method of manufacturing the nonvolatile semiconductor memory device according to the second embodiment.
Figure 12:
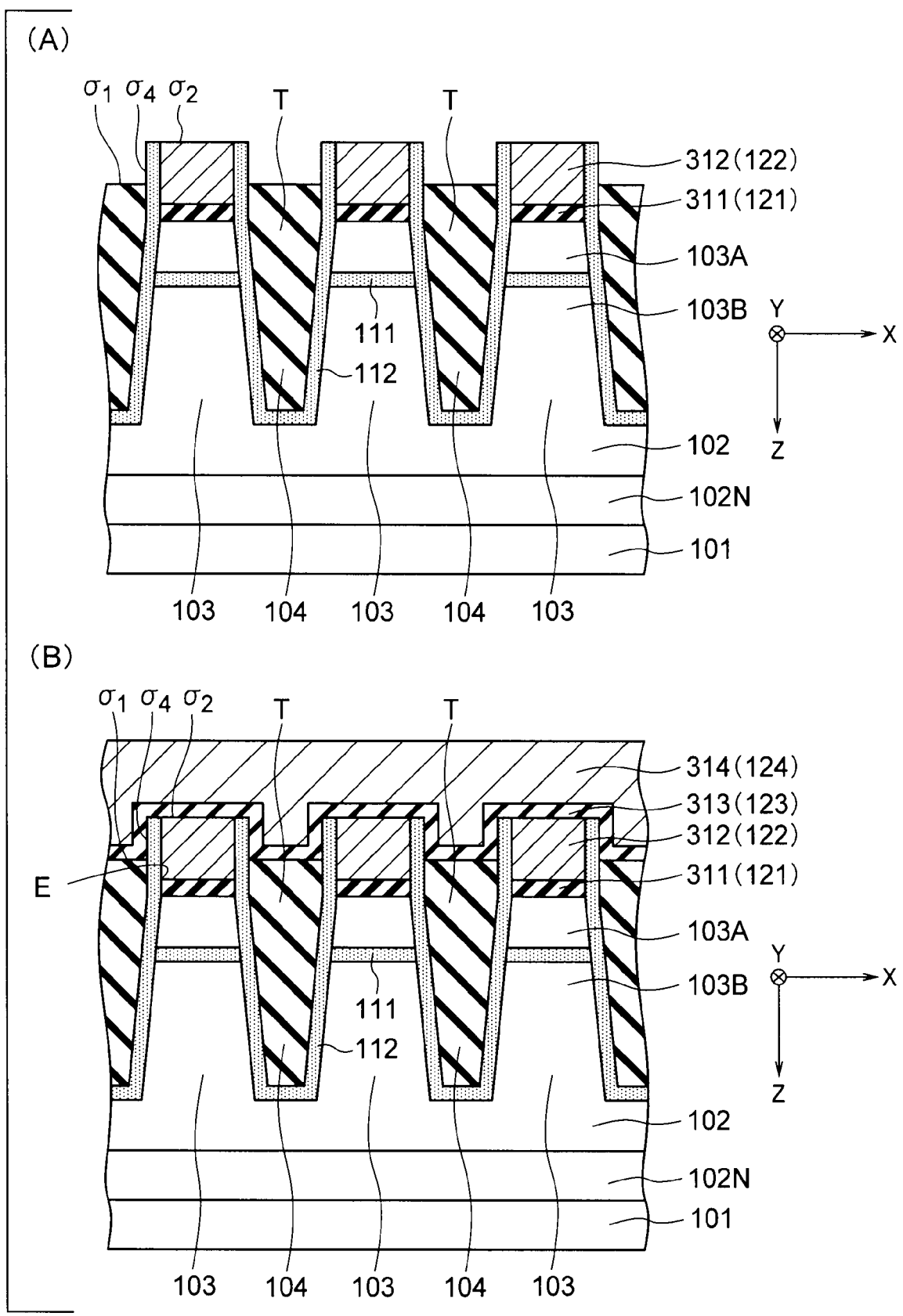

FIGS. 11 and 12 show sectional side views for explaining the method of manufacturing the nonvolatile semiconductor memory device according to the second embodiment. Each of the sectional side views shown in FIGS. 11(A) to 12(B) is an AA sectional view of the nonvolatile semiconductor memory device, taken along the line I-I' of FIG. 1.

In this embodiment, the procedures illustrated in FIGS. 5(A) to 6(B) are carried out. At this point, the procedures of FIGS. 5(A) and 5(B) may be replaced with the procedures of FIGS. 9(A) and 9(B).

Processing for forming the second diffusion suppressing layers 112 on the side surfaces $S_{1A}$ of the upper device regions 103A is performed. In this embodiment, the second diffusion suppressing layers 112 are formed by a technique other than SEG, such as chemical vapor deposition (CVD). As a result, the second diffusion suppressing layers 112 are formed (more correctly, a second diffusion suppressing layer 112 is formed) on the entire surface of the substrate 101 (FIG. 11(A)). Accordingly, the second diffusion suppressing layers 112 are formed continuously on the side surfaces $S_1$ and $S_2$ of the device regions 103 and the floating gates 122, as shown in FIG. 11(A). In this embodiment, the first and second diffusion suppressing layers 111 and 112 formed in the above manner can suppress the B atoms from diffusing due to various heating processes performed later.

After forming the second diffusion suppressing layers 112, the isolation insulators 104 to isolate the device regions 103 from one another are buried in the isolation trenches T (FIG. 11(B)). The isolation insulators 104 are formed by depositing the material of the isolation insulators 104 on the entire surface of the substrate 101, and planarizing the material by CMP by using the mask layers 321 as stoppers. Portions of the second diffusion suppressing layers 112 located on the mask layers 312 are removed by this CMP. The mask layers 321 are removed by RIE, which is performed after the CMP (FIG. 11(B)).

If the isolation insulators 104 are formed by thermal oxidation here, an oxidizing agent enters the interfaces between the floating gates 122 and the gate insulators 121, and a bird's beak is formed at each edge E. An example case where the device insolating insulators 104 are formed by thermal oxidation is a case where high-temperature oxide films (HTO films) are used as the isolation insulators 104. In FIG. 11(B), on the other hand, when the material of the isolation insulators 104 is deposited, the edges E between the lower surfaces and the side surfaces $S_2$ of the floating gates 122 are covered with the second diffusion suppressing layers 112. As a result, the oxidizing agent is prevented from entering the edges E between the lower surfaces and the side surfaces $S_2$ of the floating gates 122. Accordingly, formation of a bird's beak can be prevented at each edge E.

Etching is then performed on the isolation insulators 104, so that the upper surfaces $\sigma_1$ of the isolation insulators 104 become lower than the upper surfaces $\sigma_2$ of the first electrode layers 312 (FIG. 12(A)). Through the etching, the side surfaces of the second diffusion suppressing layers 112 that are perpendicular to the X-direction are partially exposed. In FIG. 12(A), the exposed side surfaces of the second diffusion suppressing layers 112 are denoted by $\sigma_4$.

The etching process illustrated in FIG. 12(A) is performed so that the upper surfaces $\sigma_1$ of the isolation insulators 104 become as high as a point between the upper surfaces and lower surfaces of the first electrode layers 312. Here, the etching can performed on the portions of the second diffusion suppressing layers 112 partially exposed to the side surfaces of the first electrode layers 312 that are perpendicular to the X-direction, so that the second insulator 313 can be in direct contact with the side surfaces $S_2$ of the first electrode layers 312 in FIG. 12(B). As a result, the intergate insulator 123 is formed in direct contact with the side surfaces $S_2$ of the floating gates 122, and the coupling ratio in the cell transistors 201 is not lowered.

The second insulator 313 to be the intergate insulator 123 is then formed on the first electrode layers 312 and the isolation insulators 104 (FIG. 12(B)). The second electrode layer 314 to be the control gate 124 is then formed on the second insulator 313 (FIG. 12(B)).

In this embodiment, the upper surfaces $\sigma_1$ of the isolation insulators 104 are made lower than the upper surfaces $\sigma_2$ of the first electrode layers 312 by the etching process illustrated in FIG. 12(A).

As a result, the lower surfaces of the portions of the second insulator 313 located above the isolation insulators 104 become lower than the lower surfaces of the portions of the second insulator 313 located on the first electrode layers 312, and the second insulator 313 is formed in contact with the upper surfaces $\sigma_2$ of the first electrode layers 312 and the exposed side surfaces $\sigma_4$ of the second diffusion suppressing layers 112. Also, the lower surfaces of the portions of the second electrode layer 314 located above the isolation insulators 104 become lower than the lower surfaces of the portions of the second electrode layer 314 located above the first electrode layers 312.

When the second insulator 313 is formed, the edges E between the lower surfaces and the side surfaces $S_2$ of the floating gates 122 are covered with the second diffusion suppressing layers 112. Accordingly, formation of a bird's beak can be prevented at each edge E.

The following procedures are carried out in this embodiment, i.e., the gate processing of the first insulator 311, the first electrode layers 312, the second insulator 313, and the second electrode layer 314, the formation of the source and drain regions 141 (FIG. 3), the formation of various inter layer dielectrics, contact plugs, and interconnect layers, and the likes. In this manner, the nonvolatile semiconductor memory device of this embodiment is manufactured.

As described above, in this embodiment, the first diffusion suppressing layers 111 to suppress impurity diffusion are formed in the device regions 103, to divide the device regions 103 into the upper device regions 103A and the lower device regions 103B. The second diffusion suppressing layers 112 are further formed on the side surfaces $S_{1A}$ of the upper device regions 103A that are perpendicular to the X-direction.

Accordingly, in this embodiment, the impurities in the upper device regions 103 can be suppressed from diffusing into the first diffusion suppressing layers 111 (and further into the lower device regions 103B), and diffusing into the isolation insulators 104, as in the first embodiment. Further, the impurities in the lower device regions 103B can be suppressed from diffusing into the first diffusion suppressing layers 111 and the upper device regions 103A. Furthermore, it is possible to reduce the dose loss due to outdiffusion of the impurities during the various heating processes performed after the formation of the first and second diffusion suppressing layers 111 and 112.

In this embodiment, the second diffusion suppressing layers 112 are formed continuously on the side surfaces $S_1$ and $S_2$ of the device regions 103 and the floating gates 122 that are perpendicular to the X-direction. With this arrangement, formation of a bird's beak can be prevented at each edge E between the lower surfaces and the side surfaces $S_2$ of the floating gates 122 when the isolation insulators 104 and the intergate insulator 123 are formed.

Third to Fifth Embodiments

Figure 13:
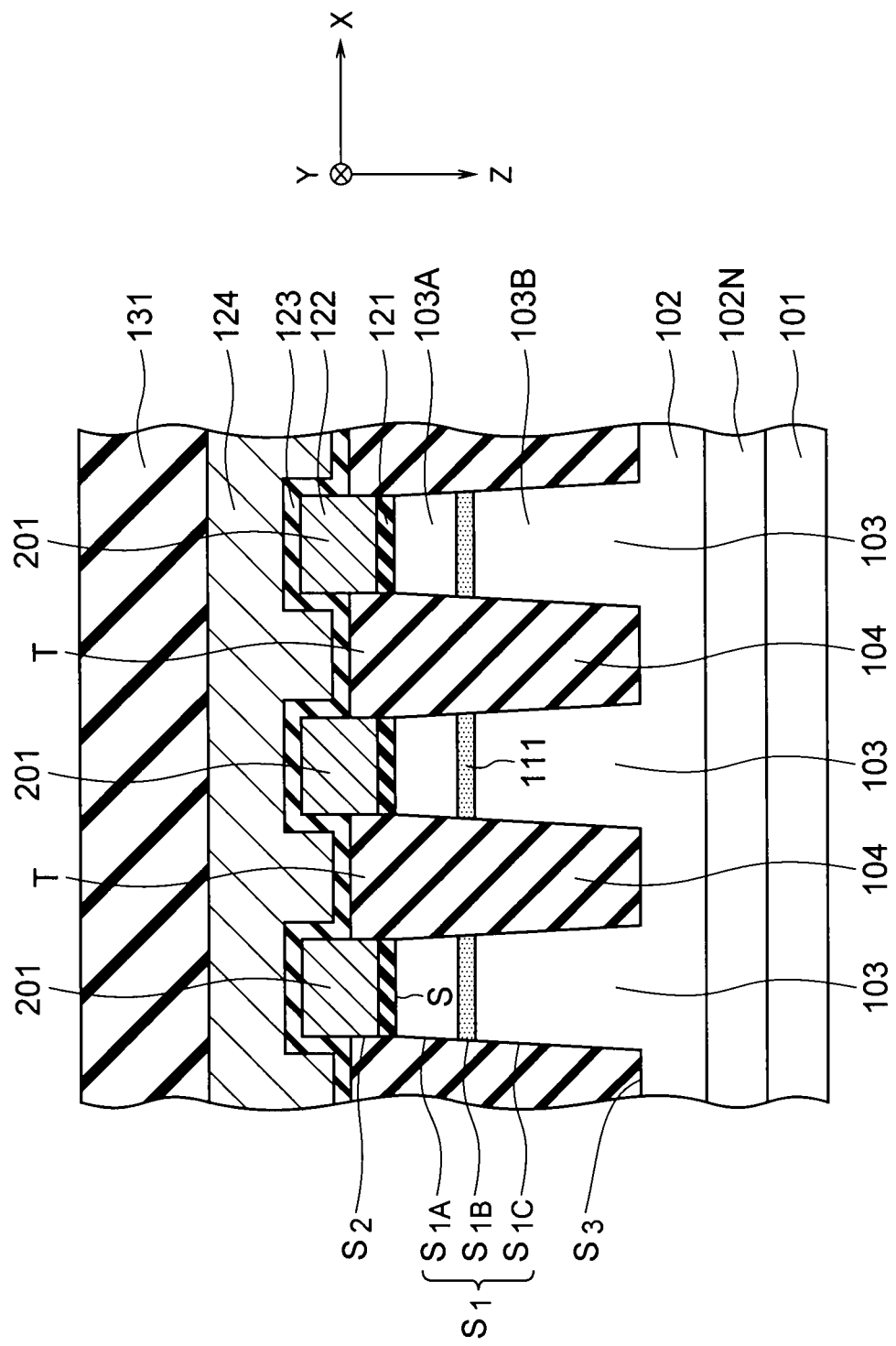
FIG. 13 is a sectional side view showing a structure of a nonvolatile semiconductor memory device according to a third embodiment.

FIG. 13 is a sectional side view showing a structure of a nonvolatile semiconductor memory device according to a third embodiment. FIG. 13 is an AA sectional view of the nonvolatile semiconductor memory device, taken along the line I-I' of FIG. 1.

In the first and second embodiments, the first and second diffusion suppressing layers 111 and 112 suppress the impurities from diffusing. In FIG. 13 (the third embodiment), on the other hand, only the first diffusion suppressing layers 111 among the first and second diffusion suppressing layers 111 and 112 are provided. Such a structure is effective in cases where diffusion of the impurities from the device regions 103 into the isolation insulators 104 hardly causes a problem.

In an example of such a case, boron (B) is also implanted in the device insolating insulators 104. Specifically, this is a case where the boron impurity concentration in the isolation insulators 104 is higher than the boron impurity concentration in the upper device regions 103A. This is because the boron in the upper device regions 103A does not diffuse into the isolation insulators 104, as the boron impurity concentration in the isolation insulators 104 is higher than the boron impurity concentration in the upper device regions 103A.

Figure 14:
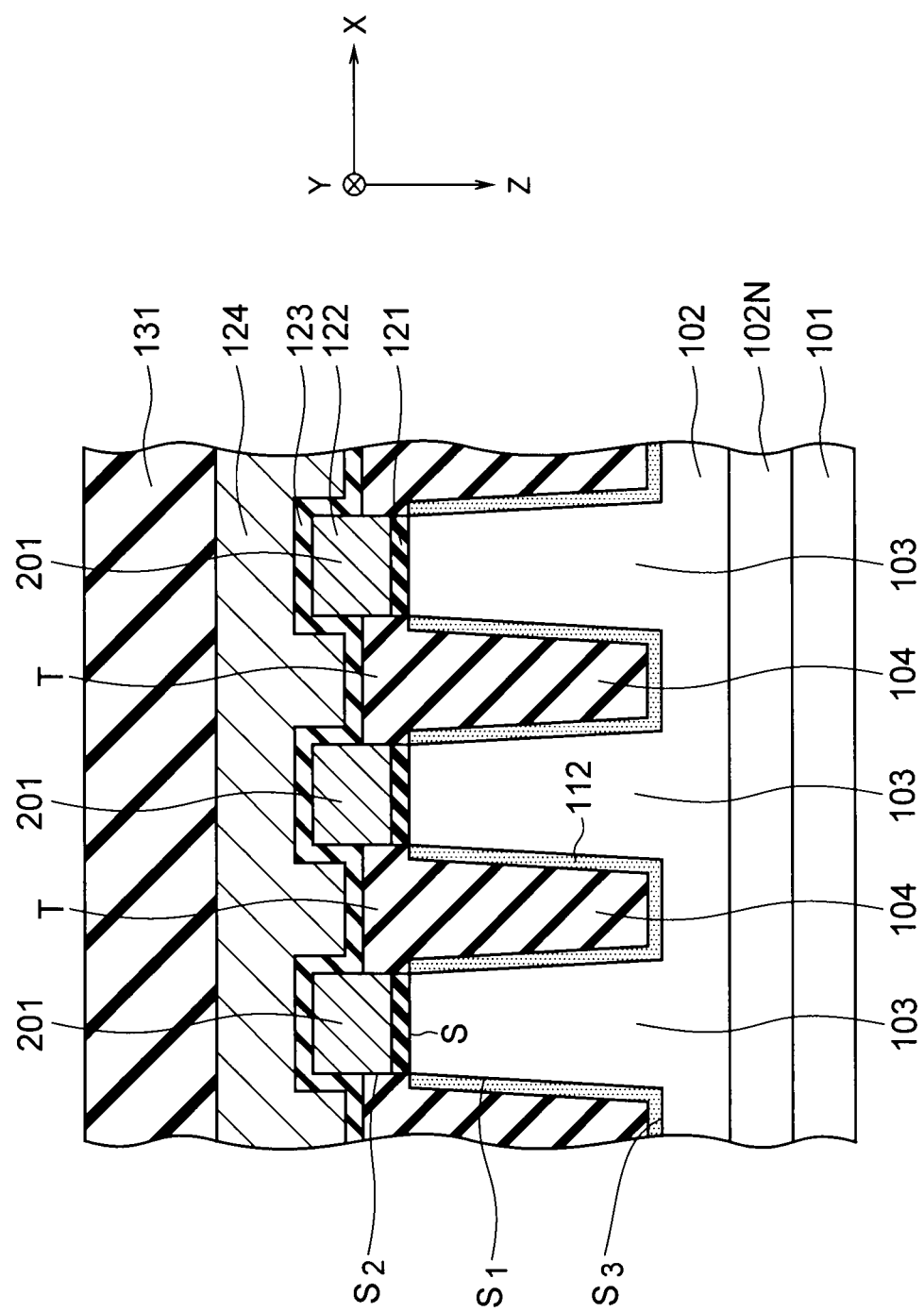
FIG. 14 is a sectional side view showing a structure of a nonvolatile semiconductor memory device according to a fourth embodiment.
Figure 15:
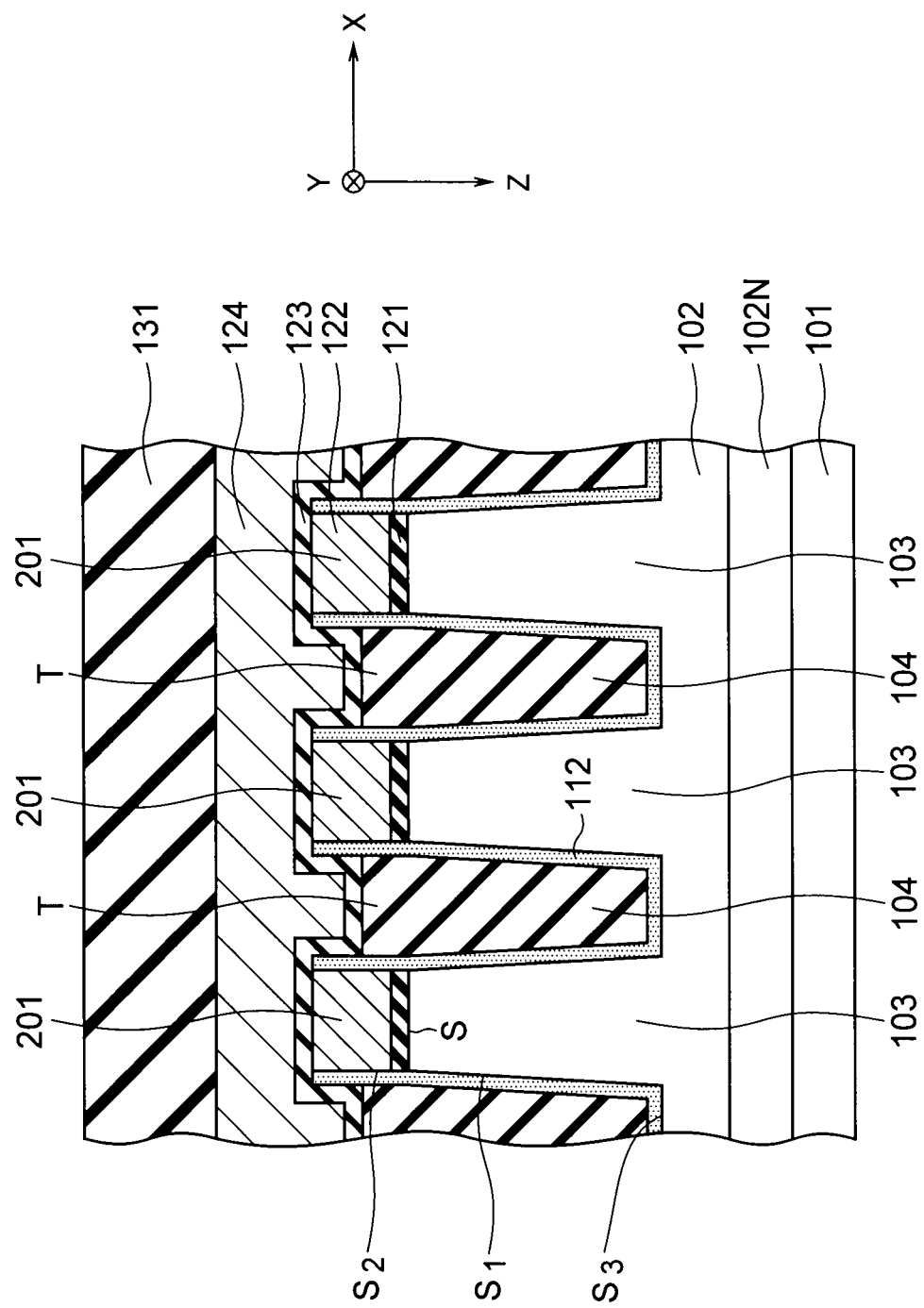
FIG. 15 is a sectional side view showing a structure of a nonvolatile semiconductor memory device according to a fifth embodiment.

FIGS. 14 and 15 are sectional side views showing structures of nonvolatile semiconductor memory devices according to fourth and fifth embodiments. FIGS. 14 and 15 are AA sectional views of the nonvolatile semiconductor memory devices, taken along the line I-I' of FIG. 1.

In FIGS. 14 and 15, only the second diffusion suppressing layers 112 among the first and second diffusion suppressing layers 111 and 112 are provided, which is the opposite of the case illustrated in FIG. 13. FIG. 14 shows a structure that is the same as the structure shown in FIG. 2, except that the first diffusion suppressing layers 111 are removed. FIG. 15 shows a structure that is the same as the structure shown in FIG. 10, except that the first diffusion suppressing layers 111 are removed. Those structures are effective in cases where the impurities in the device regions 103 are expected to be suppressed from diffusing into the isolation insulators 104, and the punch-through pressure resistance of the memory is expected to be improved.

As described above, in the third to fifth embodiments, the impurities in the device regions 103 can be suppressed from diffusing by forming the first diffusion suppressing layers 111 in the device regions 103 or forming the second diffusion suppressing layers 112 on the side surfaces $S_1$ of the device regions 103 that are perpendicular to the X-direction.

As described so far, according to the embodiments described herein, it is possible to provide a nonvolatile semiconductor memory device and a method of manufacturing the same that can suppress the impurities in the device regions (channel regions) from diffusing.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A nonvolatile semiconductor memory device comprising:
   a substrate;
   a well region formed in the substrate;
   device regions formed in the well region and defined by isolation trenches formed in the well region, the device regions extending in a first direction parallel to a principal surface of the substrate, and being adjacent to one another in a second direction that is perpendicular to the first direction;
   isolation insulators buried in the isolation trenches to isolate the device regions from one another;
   floating gates disposed on the device regions via gate insulators;
   a control gate disposed on the floating gates via an intergate insulator;
   first diffusion suppressing layers formed inside the respective device regions to divide each of the device regions into an upper device region and a lower device region; and
   second diffusion suppressing layers formed on side surfaces of the respective upper device regions, the side surfaces being perpendicular to the second direction.

2. The device according to claim 1, wherein the first and second diffusion suppressing layers are SiC (silicon carbide) layers.

3. The device according to claim 1, wherein an impurity concentration in a vicinity of the first diffusion suppressing layers is lower than an impurity concentration in the upper device regions in a vicinity of the gate insulators, and an impurity concentration in the lower device regions in positions slightly shallower than bottom portions of the isolation insulators.

4. The device according to claim 1, wherein the second diffusion suppressing layers are formed on side surfaces of the respective upper device regions, the first diffusion suppressing layers, and the respective lower device regions, the side surfaces being perpendicular to the second direction.

5. The device according to claim 1, wherein the second diffusion suppressing layers are formed only on side surfaces of the respective device regions among side surfaces of the respective device regions and the floating gates, the side surfaces of the device regions and the floating gates being perpendicular to the second direction, and
the intergate insulator is disposed in direct contact with the side surfaces of the floating gates.

6. The device according to claim 1, wherein the second diffusion suppressing layers are formed continuously on side surfaces of the respective device regions and the floating gates, the side surfaces being perpendicular to the second direction, and
the intergate insulator is disposed on the side surfaces of the floating gates via the second diffusion suppressing layers.

7. The device according to claim 1, wherein the second diffusion suppressing layers are also formed on bottom surfaces of the isolation trenches.

8. The device according to claim 1, wherein the first diffusion suppressing layers are formed in positions including points of 50 nm in depth from a surface of the substrate.

9. The device according to claim 1, wherein a depth-directional profile of an impurity concentration in the device regions has a local minimum point in the first diffusion suppressing layers.

10. The device according to claim 1, wherein the upper device regions are formed in positions including points of 10 nm in depth from a surface of the substrate.

11. The device according to claim 1, wherein a depth-directional profile of an impurity concentration in the device regions has a local maximum point in the upper device regions.

12. The device according to claim 1, wherein the lower device regions are formed in positions including points of 150 nm in depth from a surface of the substrate.

13. The device according to claim 1, wherein a depth-directional profile of an impurity concentration in the device regions has a local maximum point in the lower device regions.

14. The device according to claim 2, wherein a concentration of carbon atoms contained in the first and second diffusion suppressing layers is within a range between $1.0\times10^{18}$ and $1.0\times10^{20}$ atoms/cm$^3$.

15. A method of manufacturing a nonvolatile semiconductor memory device, the method comprising:
   forming a well region in a substrate by implanting impurities into the substrate;
   forming a first diffusion suppressing layer in the well region to divide the well region into an upper well region and a lower well region by implanting atoms for suppressing the impurities from diffusing into the well region;
   forming a first insulator on the well region;
   forming a first electrode layer on the first insulator;
   forming device regions in the well region by forming isolation trenches that penetrate through the first electrode layer, the first insulator, and the first diffusion suppressing layer, the device regions being defined to extend in a first direction parallel to a principal surface of the substrate, and to be adjacent to one another in a second direction that is perpendicular to the first direction;
   forming second diffusion suppressing layers on side surfaces of the upper well region, the side surfaces being exposed to the isolation trenches and being perpendicular to the second direction; and
   burying isolation insulators to isolate the device regions from one another in the isolation trenches, after forming the second diffusion suppressing layers.

16. The method according to claim 15, wherein the second diffusion suppressing layers are selectively formed only on side surfaces of the device regions among side surfaces of the device regions and the first electrode layer, the side surfaces of the device regions and the first electrode layer being perpendicular to the second direction.

17. The method according to claim 15, wherein the second diffusion suppressing layers are formed continuously on side surfaces of the device regions and the first electrode layer, the side surfaces being perpendicular to the second direction.

18. The method according to claim 15, wherein the atoms for suppressing the impurities from diffusing are carbon atoms.

19. A method of manufacturing a nonvolatile semiconductor memory device, the method comprising:
   preparing a substrate including a first semiconductor layer, a first diffusion suppressing layer formed on the first semiconductor layer, and a second semiconductor layer formed on the first diffusion suppressing layer;

forming a well region in the substrate by implanting impurities into the substrate, the well region including an upper well region located on the first diffusion suppressing layer and a lower well region located under the first diffusion suppressing layer;

forming a first insulator on the well region;

forming a first electrode layer on the first insulator;

forming device regions in the well region by forming isolation trenches that penetrate through the first electrode layer, the first insulator, and the first diffusion suppressing layer, the device regions being defined to extend in a first direction parallel to a principal surface of the substrate, and to be adjacent to one another in a second direction that is perpendicular to the first direction;

forming second diffusion suppressing layers on side surfaces of the upper well region, the side surfaces being exposed to the isolation trenches and being perpendicular to the second direction; and burying isolation insulators to isolate the device regions from one another in the isolation trenches, after forming the second diffusion suppressing layers.

* * * * *